(12) United States Patent
Tanabe

(10) Patent No.: US 10,340,905 B2
(45) Date of Patent: Jul. 2, 2019

(54) SEMICONDUCTOR DEVICE

(71) Applicant: Renesas Electronics Corporation, Koutou-ku, Tokyo (JP)

(72) Inventor: Akira Tanabe, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/663,728

(22) Filed: Jul. 29, 2017

(65) Prior Publication Data

US 2018/0091130 A1 Mar. 29, 2018

(30) Foreign Application Priority Data

Sep. 29, 2016 (JP) .................................. 2016-191234

(51) Int. Cl.
| | |
|---|---|
| *H03K 17/04* | (2006.01) |
| *H03K 17/041* | (2006.01) |
| *H03K 17/10* | (2006.01) |
| *H03K 17/0412* | (2006.01) |

(52) U.S. Cl.
CPC . *H03K 17/04106* (2013.01); *H03K 17/04123* (2013.01); *H03K 17/102* (2013.01); *H03K 2217/0018* (2013.01)

(58) Field of Classification Search
CPC ....... H03K 17/04106; H03K 17/04123; H03K 17/102; H03K 221/0018

USPC ......................................................... 327/537
See application file for complete search history.

(56) References Cited

U.S. PATENT DOCUMENTS

| | | | |
|---|---|---|---|
| 6,466,506 B2 | 10/2002 | Shiomi | |
| 6,977,849 B2* | 12/2005 | Tomishima | ...... G01R 31/31723 365/189.05 |
| 7,355,437 B2* | 4/2008 | Perisetty | .......... H03K 19/00315 326/14 |
| 7,368,976 B2* | 5/2008 | Gupta | .................... H03K 3/011 327/534 |

FOREIGN PATENT DOCUMENTS

JP 2002-093195 A 3/2002

\* cited by examiner

*Primary Examiner* — Dinh T Le
(74) *Attorney, Agent, or Firm* — Shapiro, Gabor and Rosenberger, PLLC

(57) ABSTRACT

Related-art back bias generation circuits cause a problem where a long time is required for transition between an operating state and a standby state because driving power is lowered to reduce the power consumption in the standby state. A back bias generation circuit outputs a predetermined voltage. The predetermined voltage is the back bias voltage of a substrate in a standby mode. A bias control circuit stores an electrical charge while a circuit block is in an operating mode, supplies the stored electrical charge to the substrate of a MOSFET included in the circuit block when the circuit block transitions from the operating mode to the standby mode, and subsequently supplies the output of the back bias generation circuit to the substrate of the MOSFET.

13 Claims, 19 Drawing Sheets

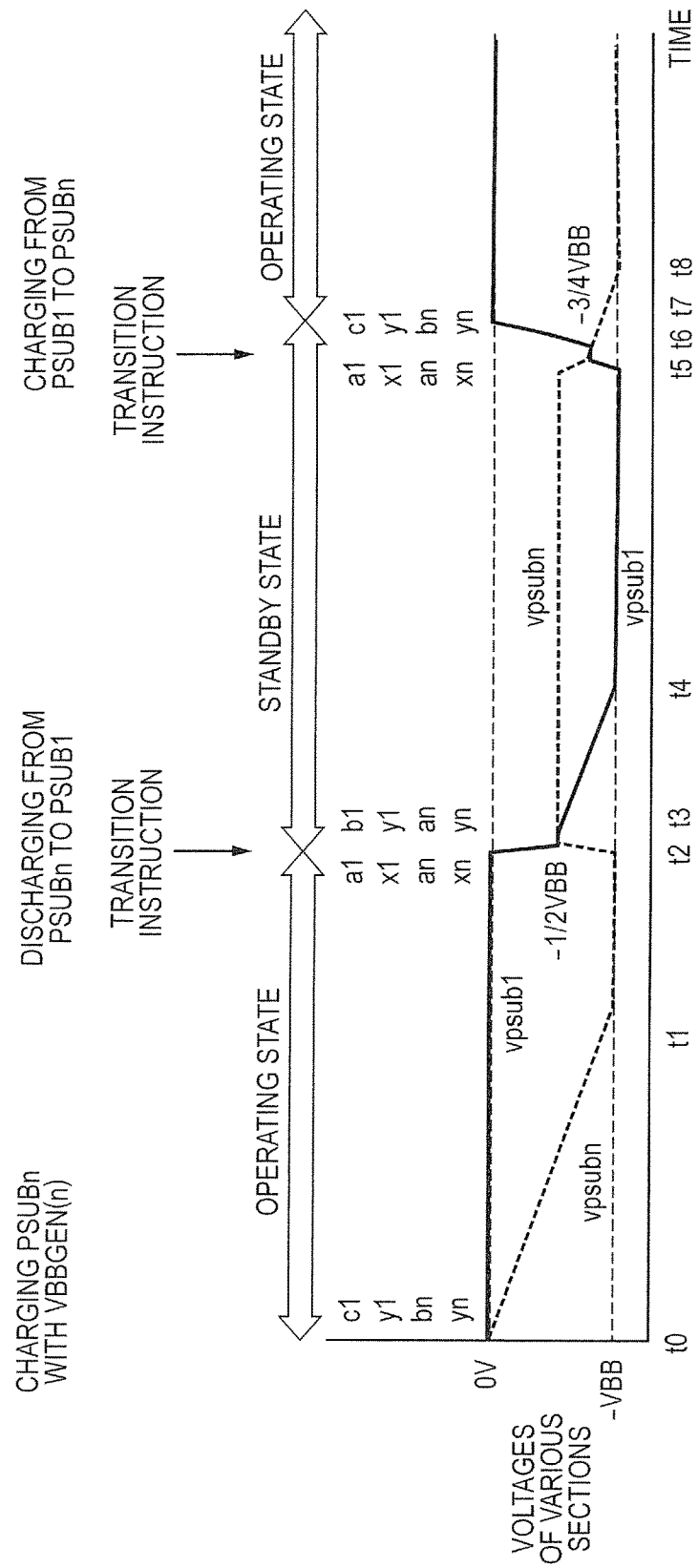

SEMICONDUCTOR DEVICE

CROSS-REFERENCE TO RELATED APPLICATIONS

The disclosure of Japanese Patent Application No. 2016-191234 filed on Sep. 29, 2016 including the specification, drawings, and abstract is incorporated herein by reference in its entirety.

BACKGROUND

The present invention relates to a semiconductor device. For example, the present invention relates to a semiconductor device capable of controlling the back bias voltage of a MOSFET (Metal-Oxide-Semiconductor Field-Effect Transistor).

There has been a known technology for controlling a back bias voltage of a substrate in order to change the threshold voltage of a MOSFET as needed to reduce a leakage current in a standby state.

SUMMARY

However, the driving power of a related-art circuit for generating the back bias voltage is lowered to reduce the power required for the standby state. This causes a problem where a long time is required for transition between an operating state and the standby state.

Other problems and novel features will become apparent from the following description and from the accompanying drawings.

In an aspect of the present invention, a bias control circuit stores a supplied electrical charge while a circuit block is in an operating mode. When the circuit block transitions from the operating mode to a standby mode, the bias control circuit supplies the stored electrical charge to a MOSFET substrate included in the circuit block, and then supplies the output of a voltage generation circuit to the MOSFET substrate.

The above aspect of the present invention reduces the time required for transition between an operating state and a standby state.

BRIEF DESCRIPTION OF THE DRAWINGS

FIG. 22 is a timing diagram illustrating an operation of the circuit shown in FIG. 21.

DETAILED DESCRIPTION

Embodiments of the present invention will now be described with reference to the accompanying drawings.

First Embodiment

Figure 1:
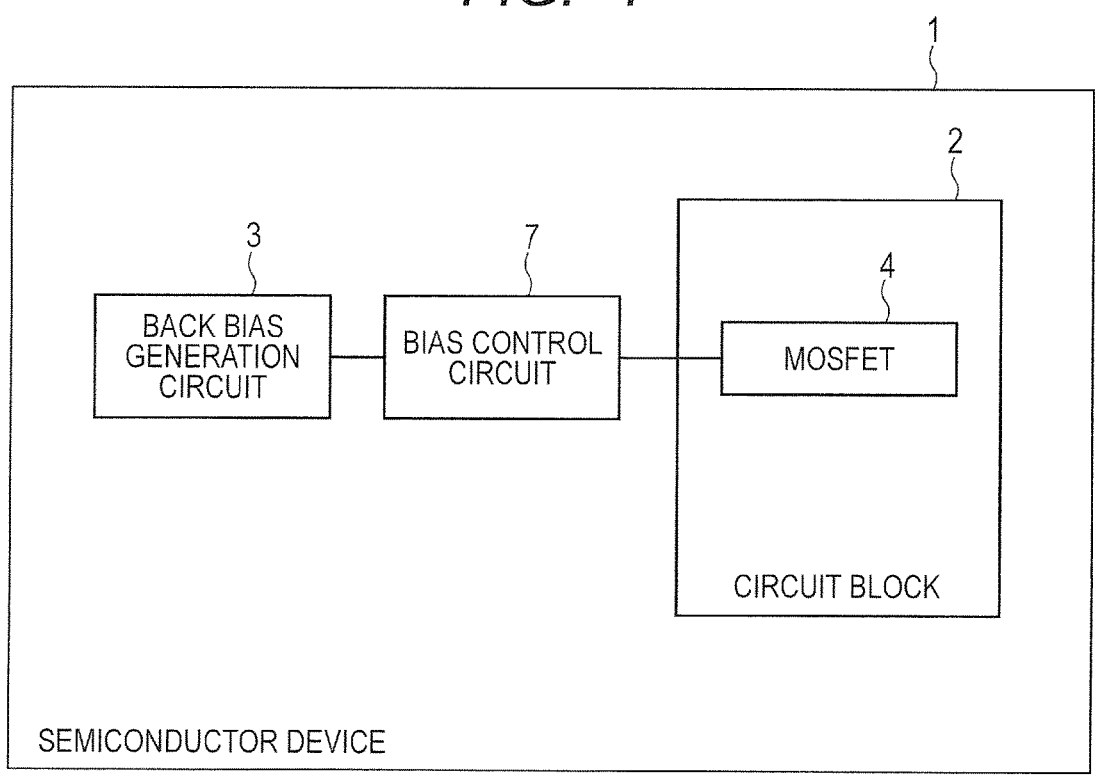
FIG. 1 is a diagram illustrating a configuration of a semiconductor device according to a first embodiment of the present invention.

FIG. 1 is a diagram illustrating a configuration of a semiconductor device 1 according to a first embodiment of the present invention.

A circuit block 2 has two operation states, namely, an operating mode and a standby mode. The circuit block 2 includes a MOSFET 4.

A back bias generation circuit 3 outputs a predetermined voltage. The predetermined voltage is a back bias voltage of a substrate in the standby mode.

A bias control circuit 7 stores an electrical charge while the circuit block 2 is in the operating mode. When the circuit block 2 transitions from the operating mode to the standby mode, the bias control circuit 7 supplies the stored electrical charge to the substrate of the MOSFET 4 included in the circuit block 2, and then supplies the output of the back bias generation circuit 3 to the substrate of the MOSFET 4.

As described above, when the circuit block transitions from the operating mode to the standby mode, the first embodiment first supplies to the substrate of the MOSFET the electrical charge stored while the circuit block is in the operating mode. As a result, the time required for transition from an operating state to a standby state is shorter than when the output of the back bias generation circuit is initially supplied to the substrate of the MOSFET.

Second Embodiment

Figure 2:
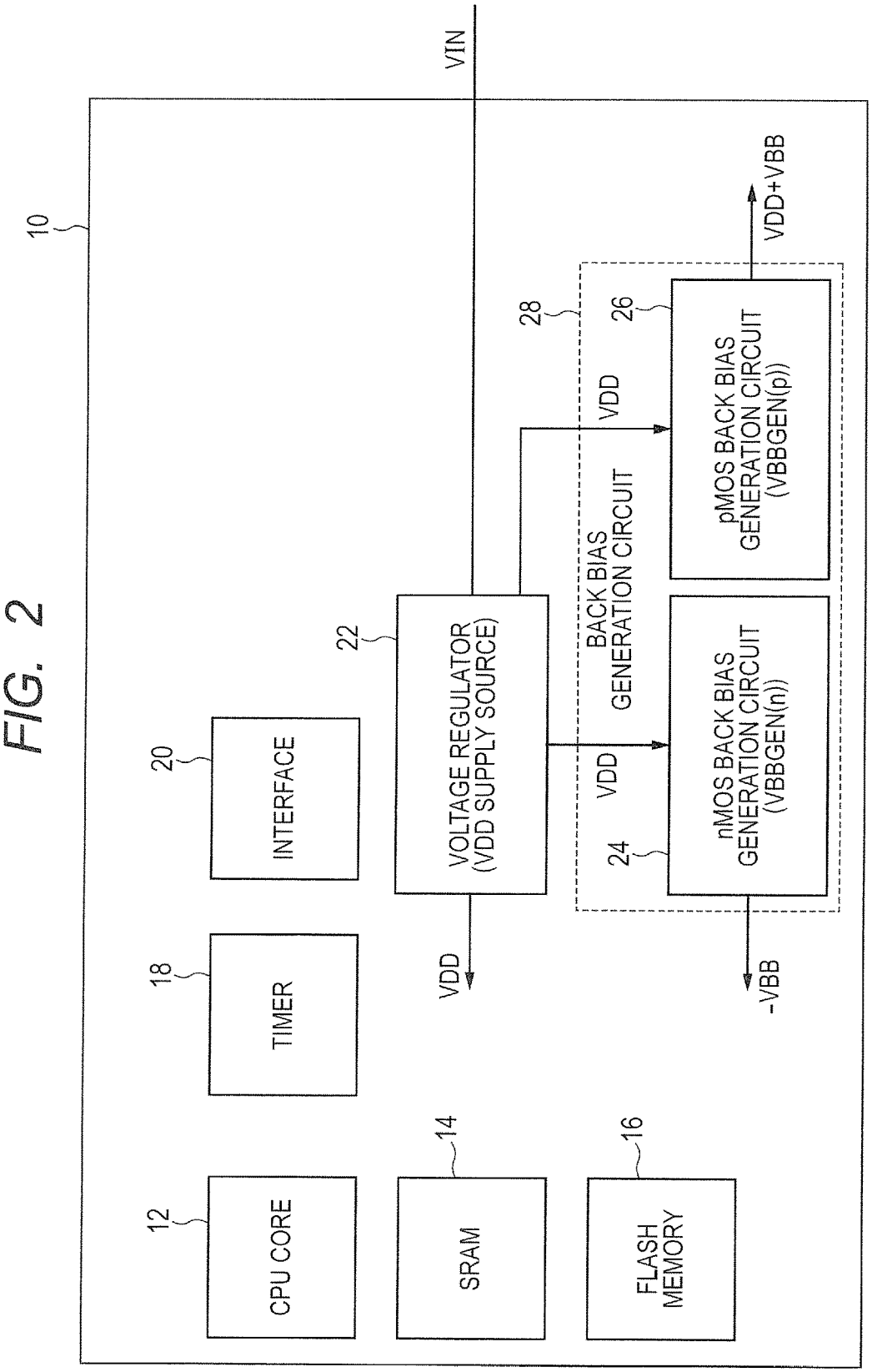
FIG. 2 is a diagram illustrating a configuration of the semiconductor device according to a second embodiment of the present invention.

FIG. 2 is a diagram illustrating a configuration of a semiconductor device 10 according to a second embodiment of the present invention.

The semiconductor device 10 is a microcomputer capable of controlling the back bias voltage. As illustrated in FIG. 2, the semiconductor device 10 includes functional blocks such as a CPU (Central Processing Unit) core 12, a SRAM (Static Random Access Memory) 14, a flash memory 16, a timer 18, and an interface 20. These functional blocks are mounted on an IC (Integrated Circuit) chip.

The semiconductor device 10 further includes a voltage regulator 22 and a back bias generation circuit 28.

The voltage regulator 22 receives a power supply voltage VIN from the outside of the chip, converts the power supply voltage to an internal voltage VDD, and supplies the internal voltage VDD to the functional blocks. In the subsequent description, the voltage regulator 22 may be referred to as the VDD supply source.

The back bias generation circuit 28 includes an NMOS back bias generation circuit (VBBGEN(n)) 24 and a PMOS back bias generation circuit (VBBGEN(p)) 26.

The VBBGEN(n) 24 generates a back bias voltage (−VBB) from the internal voltage VDD and supplies the generated back bias voltage (−VBB) to a substrate PSUB for an NMOS transistor in each functional block.

The VBBGEN(p) 26 generates a back bias voltage (VDD+VBB) from the internal voltage VDD and supplies the generated back bias voltage (VDD+VBB) to a substrate NSUB for a PMOS transistor in each functional block.

A threshold voltage VTH of the MOSFET can be changed in accordance with a back bias voltage vsub. For the NMOS transistor, the back bias voltage vsub is made negative to increase the absolute value of the threshold voltage VTH. For the PMOS transistor, the back bias voltage vsub is conversely made positive to increase the absolute value of the threshold voltage VTH.

Figure 3A:
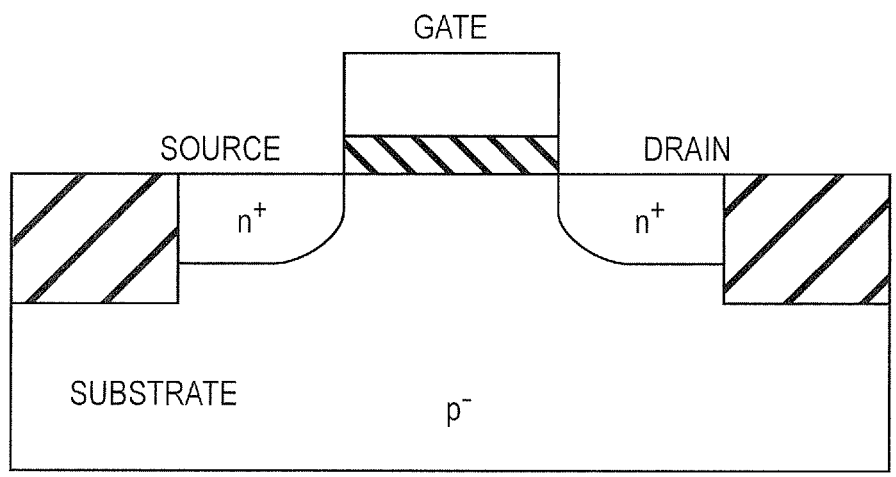
FIG. 3A is a diagram illustrating a configuration of a bulk MOSFET.

FIG. 3A is a diagram illustrating a configuration of a bulk MOSFET.

As regards the bulk MOSFET, its source-drain terminal is coupled to the substrate by p-n junction. Therefore, an acceptable back bias voltage setting is restricted to a range where no p-n junction forward current flows.

Figure 3B:
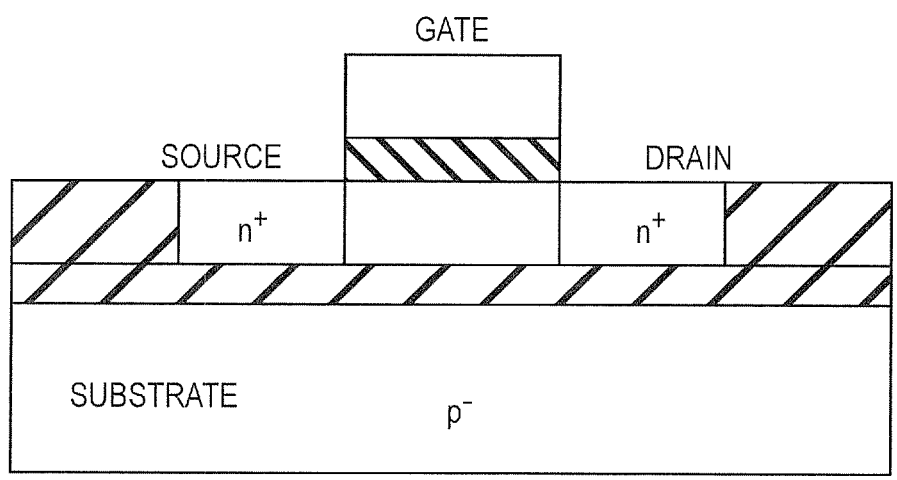
FIG. 3B is a diagram illustrating a configuration of an SOI (Silicon on Insulator) MOSFET.

FIG. 3B is a diagram illustrating a configuration of an SOI (Silicon on Insulator) MOSFET.

As regards the SOI MOSFET, its source-drain terminal is insulated from the substrate by a silicon oxide film layer. Therefore, the acceptable back bias voltage setting is not restricted to a range where no p-n junction forward current flows.

Figure 4A:
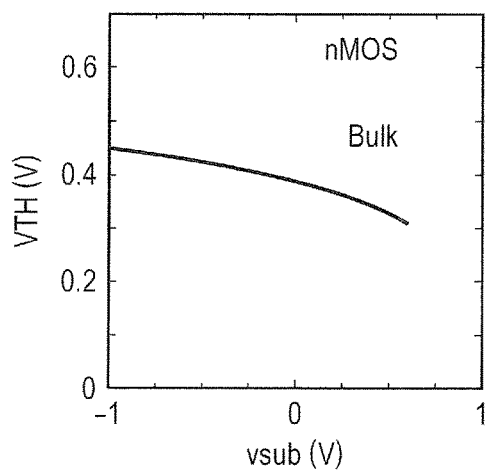
FIG. 4A is a diagram illustrating the relationship between the back bias voltage vsub and threshold voltage VTH of a bulk NMOS transistor.
Figure 4B:
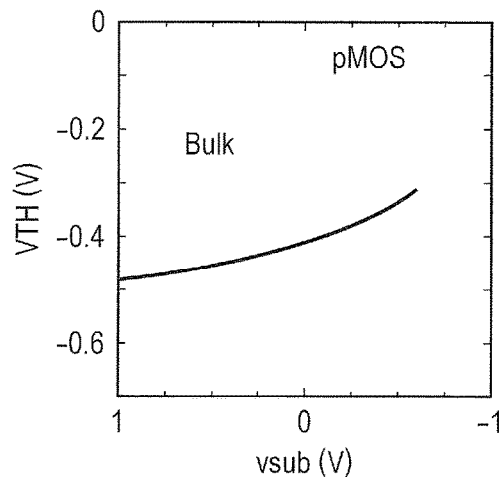
FIG. 4B is a diagram illustrating the relationship between the back bias voltage vsub and threshold voltage VTH of a bulk PMOS transistor.
Figure 4C:
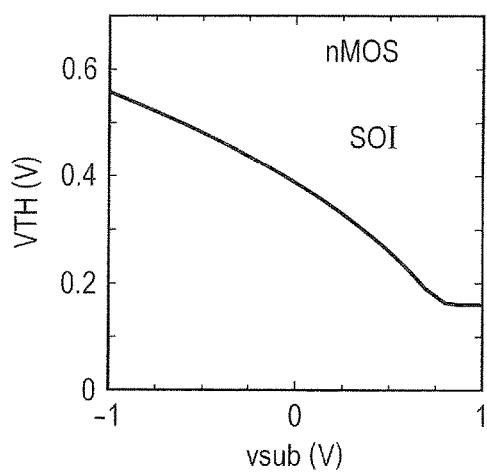
FIG. 4C is a diagram illustrating the relationship between the back bias voltage vsub and threshold voltage VTH of an SOI NMOS transistor.
Figure 4D:
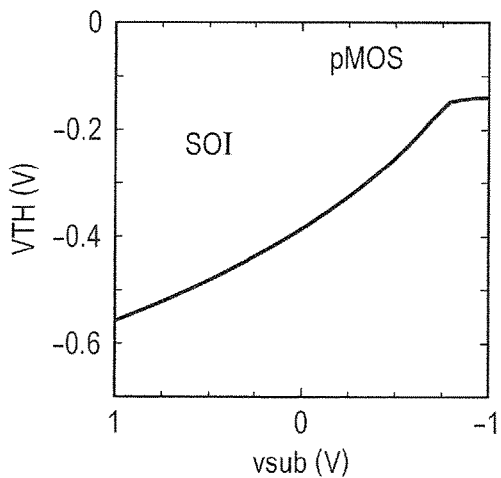
FIG. 4D is a diagram illustrating the relationship between the back bias voltage vsub and threshold voltage VTH of an SOI PMOS transistor.

FIG. 4A is a diagram illustrating the relationship between the back bias voltage vsub and threshold voltage VTH of a bulk NMOS transistor. FIG. 4B is a diagram illustrating the relationship between the back bias voltage vsub and threshold voltage VTH of a bulk PMOS transistor. FIG. 4C is a diagram illustrating the relationship between the back bias voltage vsub and threshold voltage VTH of an SOI NMOS transistor. FIG. 4D is a diagram illustrating the relationship between the back bias voltage vsub and threshold voltage VTH of an SOI PMOS transistor.

As illustrated in FIGS. 4A to 4D, a comparison between the SOI and the bulk shows that the former is larger in the amount of threshold voltage VTH change relative to the back bias voltage vsub, that is, in dVTH/dvsub, and is capable of changing the back bias voltage vsub by a larger amount. Thus, as a whole, the SOI is capable of changing the threshold voltage VTH by a larger amount than the bulk.

Figure 5A:
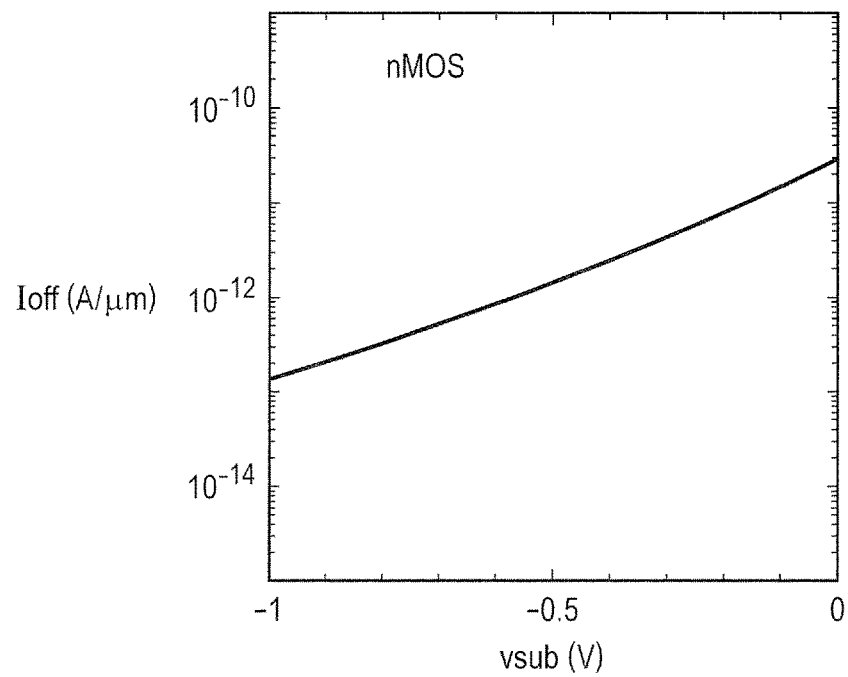
FIG. 5A is a diagram illustrating an exemplary relationship between a source-drain leakage current Ioff in the OFF state and back bias voltage vsub of an SOI NMOS transistor.

FIG. 5A is a diagram illustrating an exemplary relationship between a source-drain leakage current Ioff in the OFF state and back bias voltage vsub of the SOI NMOS transistor.

Figure 5B:
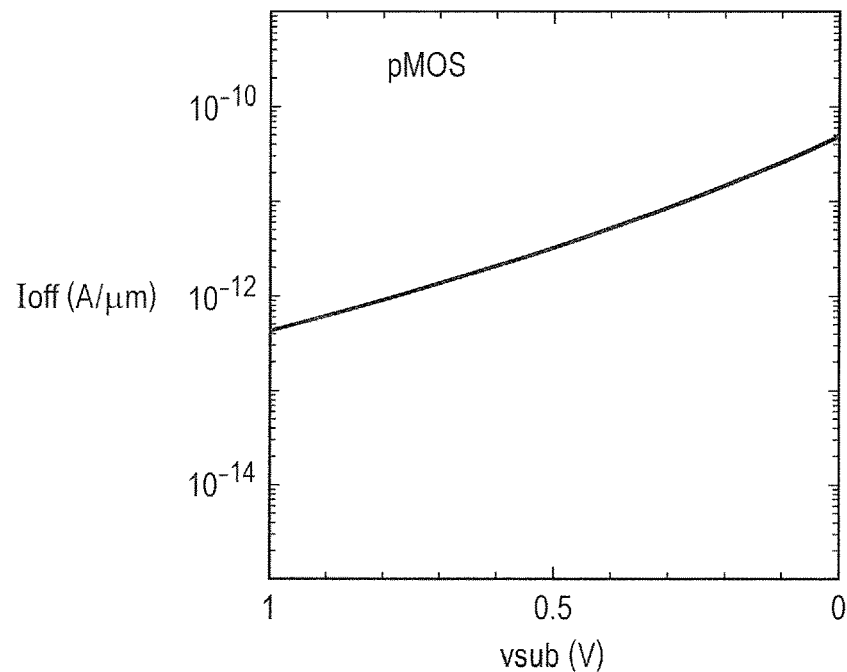
FIG. 5B is a diagram illustrating an exemplary relationship between the source-drain leakage current Ioff in the OFF state and back bias voltage vsub of an SOI PMOS transistor.

FIG. 5B is a diagram illustrating an exemplary relationship between the source-drain leakage current Ioff in the OFF state and back bias voltage vsub of an SOI PMOS transistor.

As regards the MOSFET, a dominant factor for causing a leakage current is a subthreshold leakage current. For the NMOS transistor, the leakage current Ioff can be decreased by making the back bias voltage vsub negative. For the PMOS transistor, the leakage current Ioff can be decreased by making the back bias voltage vsub positive.

Here, the leakage current Ioff changes exponentially relative to changes in the back bias voltage vsub. Therefore, the amount of change in the leakage current Ioff increases when the back bias voltage vsub is in the vicinity of 0 V, and decreases with an increase in the back bias voltage vsub.

Figure 6:
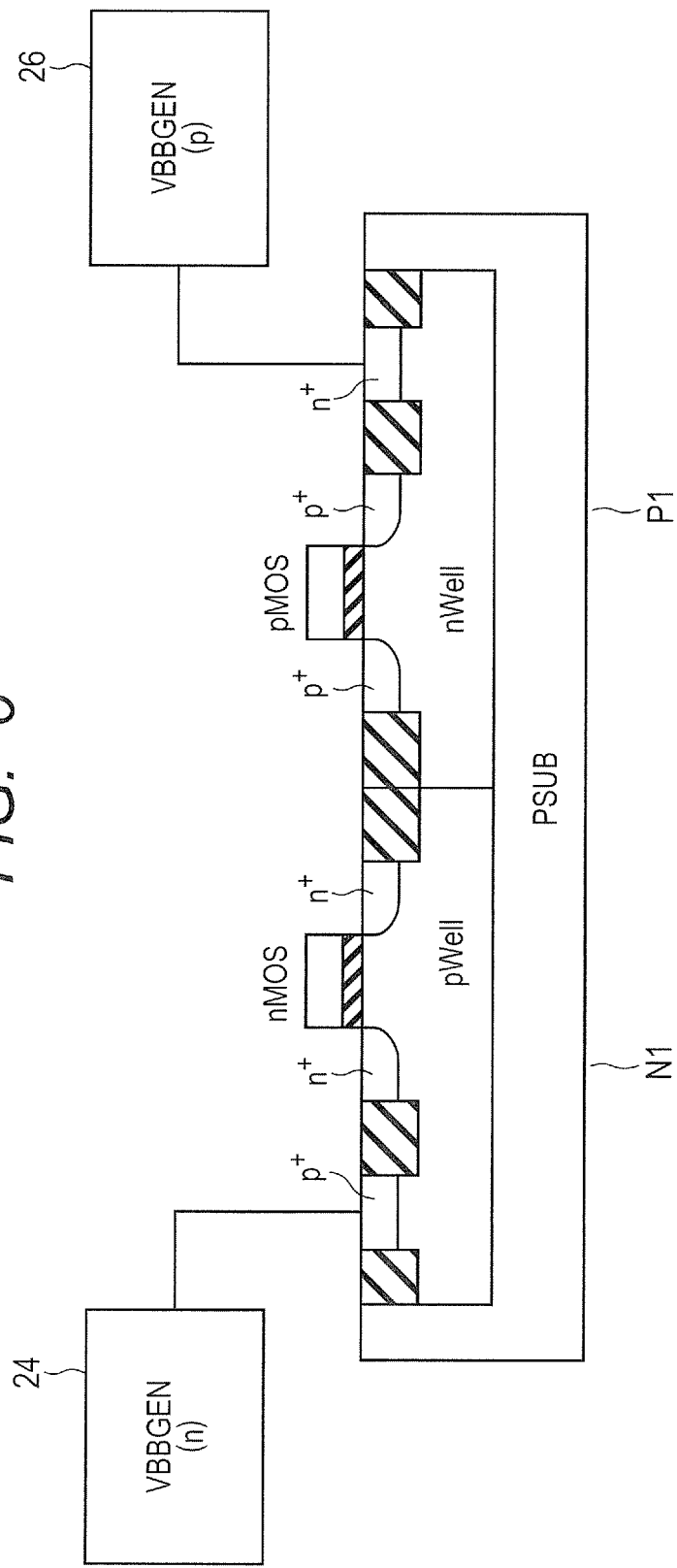
FIG. 6 is a diagram illustrating an example of a back bias voltage control method.

FIG. 6 is a diagram illustrating an example of a back bias voltage control method. An NMOS transistor N1 and a PMOS transistor P1 are formed in a pWell and an nWell, respectively. The pWell is coupled to a dedicated back bias generation circuit (VBBGEN(n)) 24, and the nWell is coupled to a dedicated back bias generation circuit (VBBGEN(p)) 26.

The back bias voltage of the NMOS transistor N1 and the back bias voltage of the PMOS transistor P1 simultaneously change.

The threshold voltage VTH of the PMOS transistor P1 and the threshold voltage VTH of the NMOS transistor N1 are set to be low when the circuit block in the semiconductor device is operating, that is, in the operating state. This increases a switching speed to achieve high-speed operation. Meanwhile, threshold voltage VTH of the PMOS transistor P1 and the threshold voltage VTH of the NMOS transistor N1 are set to be high when the circuit block in the semiconductor device is stopped, that is, in the standby state. This decreases the leakage current to provide low power consumption. When the back bias voltage is dynamically controlled as described above, high-speed operation and low power consumption can be both achieved.

Figure 7:
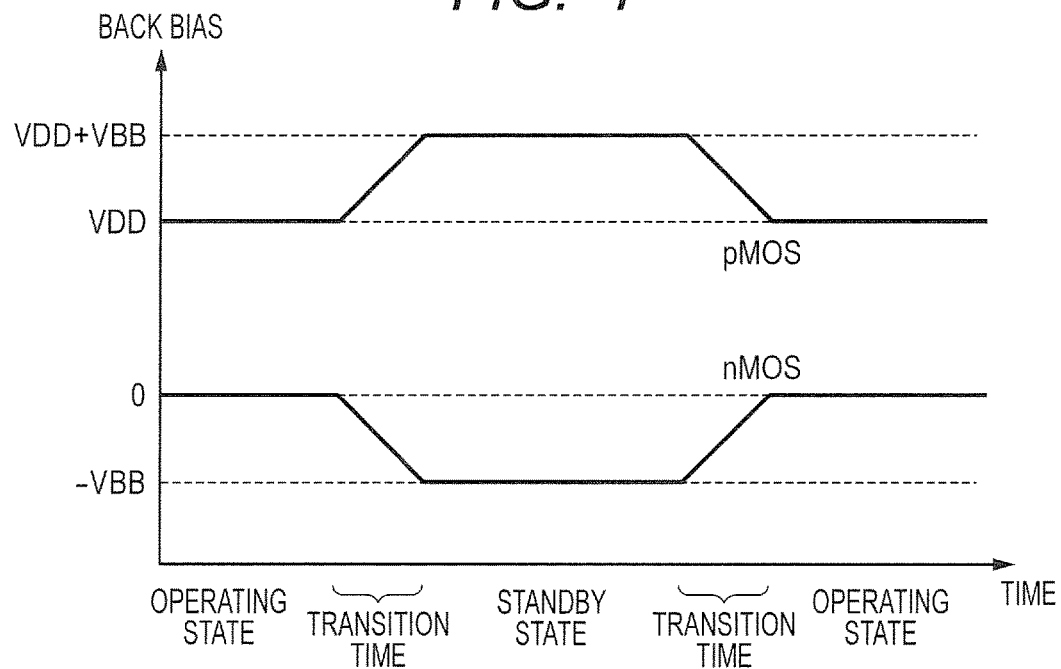
FIG. 7 is a diagram illustrating an example of back bias voltage control in an operating state and standby state of a circuit block.

FIG. 7 is a diagram illustrating an example of back bias voltage control in the operating state and standby state of the circuit block. It is assumed that the power supply voltage of the circuit block is VDD.

When, in the operating state, the back bias voltage of the NMOS transistor N1 is set to 0 V and the back bias voltage of the PMOS transistor P1 is set to VDD, the absolute value of the threshold voltage VTH of the NMOS transistor and the absolute value of the threshold voltage VTH of the PMOS transistor both decrease. This increases an ON current to provide high-speed operation.

Next, in the standby state, the back bias voltage of the NMOS transistor N1 is set to (−VBB), and the back bias voltage of the PMOS transistor P1 is set to (VDD+VBB).

The above causes an increase in the absolute value of the threshold voltage VTH of the NMOS transistor and in the absolute value of the threshold voltage VTH of the PMOS transistor. As this decreases the leakage current, the current consumption in the standby state can be reduced.

In order to provide practical control of the back bias voltage, however, the back bias voltage needs to be rapidly changed to reduce the time required for transition between the operating state and the standby state. A MOSFET substrate can be regarded as a capacitor circuit no matter whether it is a bulk or an SOI. Thus, the substrate needs to be charged and discharged at high speed in order to reduce the transition time. For such high-speed charging and discharging, it is essential that the driving power of the back bias generation circuit be sufficiently high relative to the capacitance of the substrate.

In general, when the back bias voltage vnsub of the NMOS transistor is to be made negative by using a circuit operating on a single power supply voltage VDD, a charge pump circuit or other DC-DC converter is used to generate the back bias voltage vnsub from VDD. At the same time, the back bias voltage vpsub of the PMOS transistor needs to be equal to or higher than VDD. The back bias voltages vnsub, vpsub are generated by using a DC-DC converter. Therefore, it is necessary to increase the driving power of the DC-DC converter. When, for example, a charge pump circuit, which is a kind of DC-DC converter, is used to increase the driving power, it is necessary to raise the switching frequency or increase the pump capacity. However, these two methods both increase the power consumption of the charge pump circuit. When the power consumption in the standby state is to be reduced by controlling the back bias voltage, an increase in the power consumption of the charge pump circuit exerts an adverse effect. Consequently, related-art back bias generation circuits cause a problem where a longtime is required for transition between the operating state and the standby state because the driving power is lowered to reduce the power consumption in the standby state.

The above problem can be addressed by the present embodiment.

Figure 8:
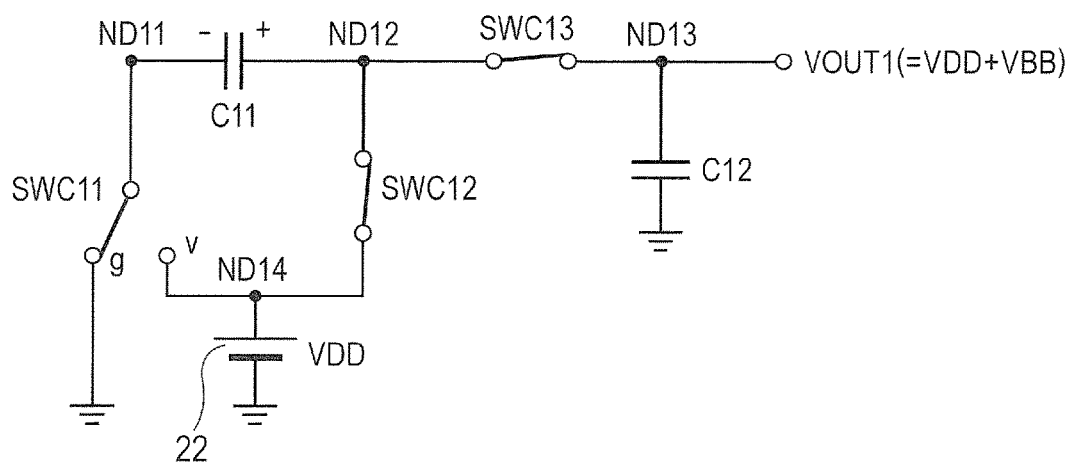
FIG. 8 is a diagram illustrating a configuration of a circuit included in a VBBGEN(p)

FIG. 8 is a diagram illustrating a configuration of a circuit included in the VBBGEN(p) 26.

The VBBGEN(p) 26 is a general charge pump circuit. The VBBGEN(p) 26 generates a positive voltage (VDD+VBB) from an input voltage VDD and outputs the positive voltage (VDD+VBB) from an output terminal VOUT1.

The VBBGEN(p) 26 includes switches SWC11, SWC12, SWC13, capacitors C11, C12, and a VDD supply source 22 for supplying the voltage VDD.

The switch SWC11 couples a node ND11 to either a terminal g or a terminal v. The terminal g is coupled to a ground GND. The terminal v is coupled to a node ND14. The capacitor C11 is disposed between the node ND11 and a node ND12. The switch SWC12 opens or closes a path between the node ND12 and the node ND14. The VDD supply source 22 is disposed between the node ND14 and the ground GND. The switch SWC13 opens or closes a path between the node ND12 and a node ND13. The capacitor C12 is disposed between the node ND13 and the ground GND. The node ND13 is coupled to the output terminal VOUT1.

Figure 9A:
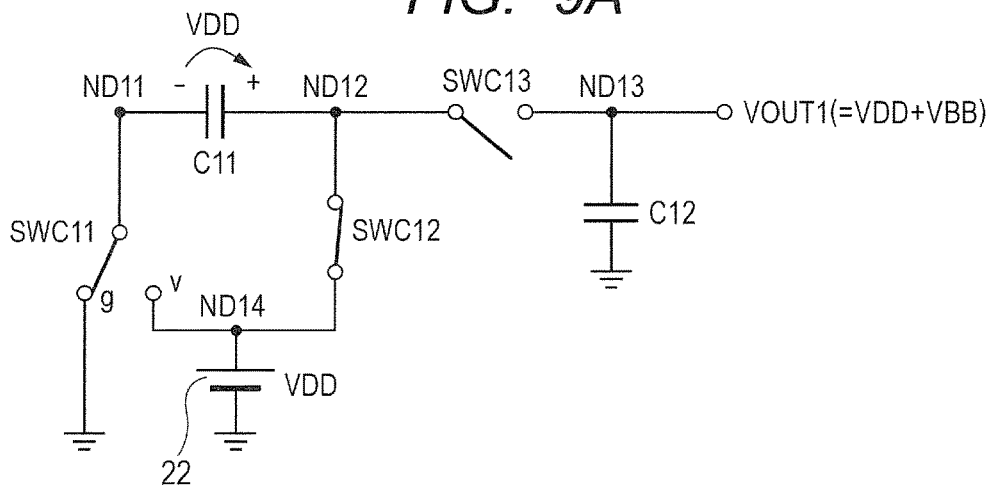
FIGS. 9A and 9B are diagrams illustrating an operation of the VBBGEN(p)
Figure 9B:
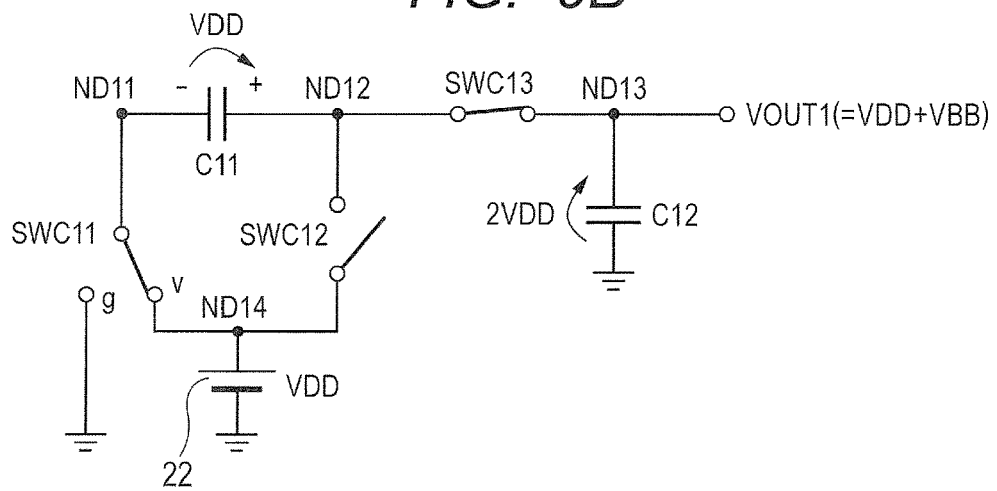

FIGS. 9A and 9B are diagrams illustrating an operation of the VBBGEN(p) 26.

First of all, as illustrated in FIG. 9A, the switch SWC11 is set to g, the switch SWC12 is turned on, and the switch SWC13 is turned off. This stores the voltage VDD across the capacitor C11.

Next, as illustrated in FIG. 9B, the switch SWC11 is set to v, the switch SWC12 is turned off, and the switch SWC13 is turned on. The voltage VDD is then developed at a negative terminal (−) of the capacitor C11. Thus, the voltage at a positive terminal (+) of the capacitor C11 is 2*VDD. That is to say, the output terminal VOUT1 outputs a voltage that is two times the input voltage VDD.

FIG. 8 illustrates a circuit that generates a voltage of 2*VDD from the input voltage VDD. When VBB>VDD, a high voltage, such as 3*VDD or 4*VDD, can be generated by coupling plural pieces of this circuit in series. When VBB<VDD, a desired voltage of VBB+VDD can be generated by decreasing the output voltage of this circuit.

Figure 10:
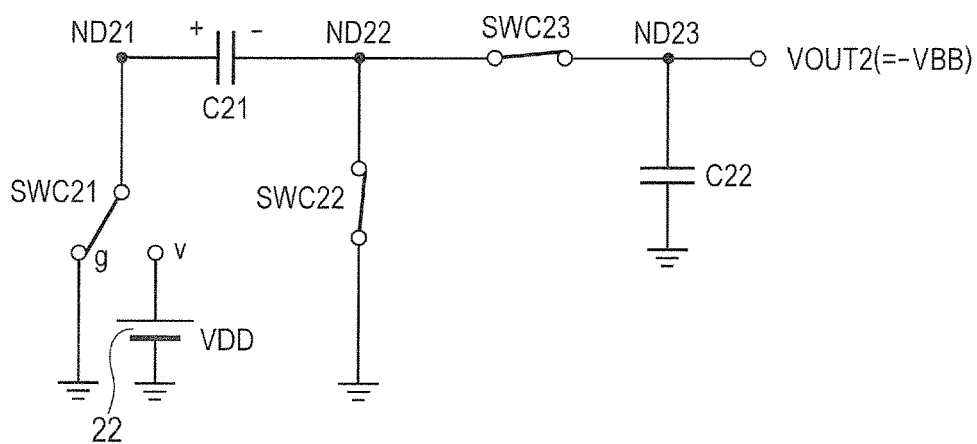
FIG. 10 is a diagram illustrating a configuration of a circuit included in a VBBGEN(n)

FIG. 10 is a diagram illustrating a configuration of a circuit included in the VBBGEN(n) 24.

The VBBGEN(n) 24 is a general charge pump circuit. The VBBGEN (n) 24 generates a negative voltage (−VBB) from an input voltage VDD and outputs the negative voltage (−VBB) from an output terminal VOUT2.

The VBBGEN(n) 24 includes switches SWC21, SWC22, SWC23, capacitors C21, C22, and a VDD supply source 22 for supplying the voltage VDD.

The switch SWC21 couples a node ND21 to either a terminal g or a terminal v. The terminal g is coupled to the ground GND. The terminal v is coupled to the VDD supply source 22. The capacitor C21 is disposed between a node ND21 and a node ND22. The switch SWC22 opens or closes a path between the node ND22 and the ground GND. The VDD supply source 22 is disposed between the terminal v and the ground GND. The switch SWC23 opens or closes a path between the node ND22 and a node ND23. The capacitor C22 is disposed between the node ND23 and the ground GND. The node ND23 is coupled to the output terminal VOUT2.

Figure 11A:
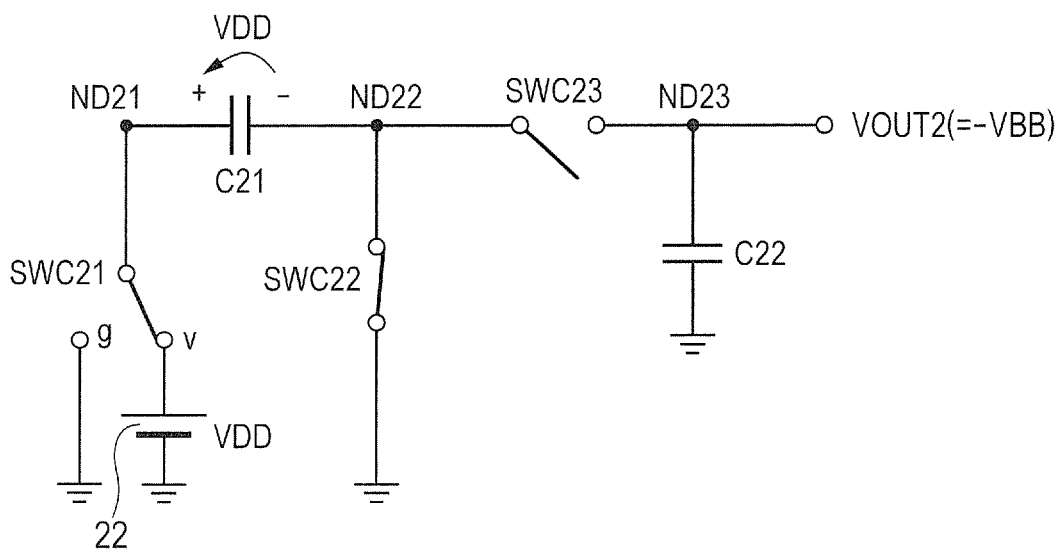
FIGS. 11A and 11B are diagrams illustrating an operation of the VBBGEN(n)
Figure 11B:
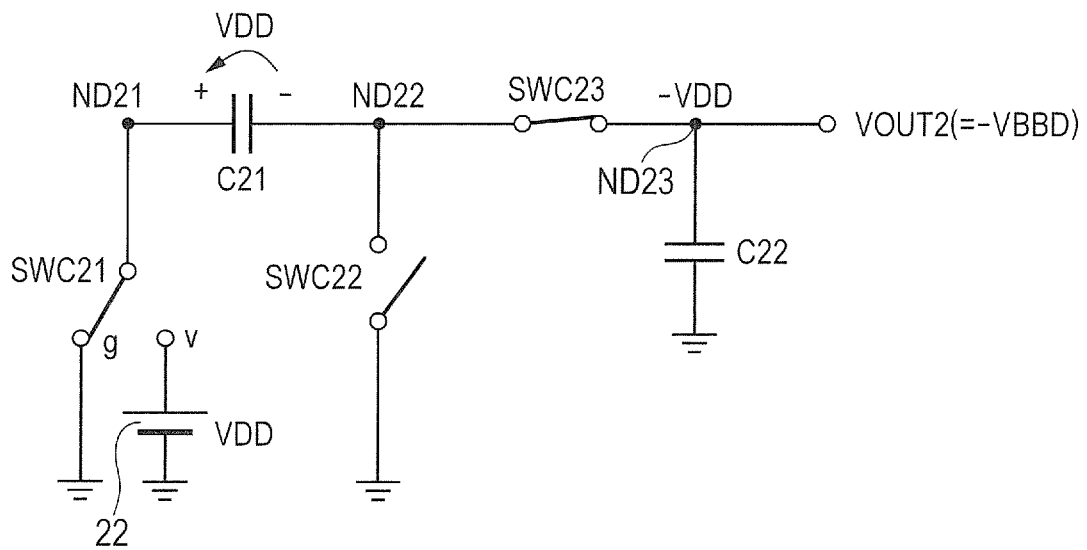

FIGS. 11A and 11B are diagrams illustrating an operation of the VBBGEN(n) 24.

First of all, as illustrated in FIG. 11A, the switch SWC21 is set to v, the switch SWC22 is turned on, and the switch SWC23 is turned off. This stores the voltage VDD across the capacitor C21.

Next, as illustrated in FIG. 11B, the switch SWC21 is set to g, the switch SWC22 is turned off, and the switch SWC23 is turned on. The voltage at a positive terminal of the capacitor C21 is then 0 V. Thus, the voltage at a negative terminal of the capacitor C21 is (−VDD). That is to say, the output terminal VOUT2 outputs a voltage having an opposite sign to the input voltage VDD.

FIG. 10 illustrates a circuit that generates a voltage of *VDD from the input voltage VDD. When VBB>VDD, a high voltage, such as (−2)*VDD or (−3)*VDD, can be generated by coupling plural pieces of this circuit in series. When VBB<VDD, a desired voltage of −VBB can be generated by decreasing the output voltage of this circuit.

Figure 12:
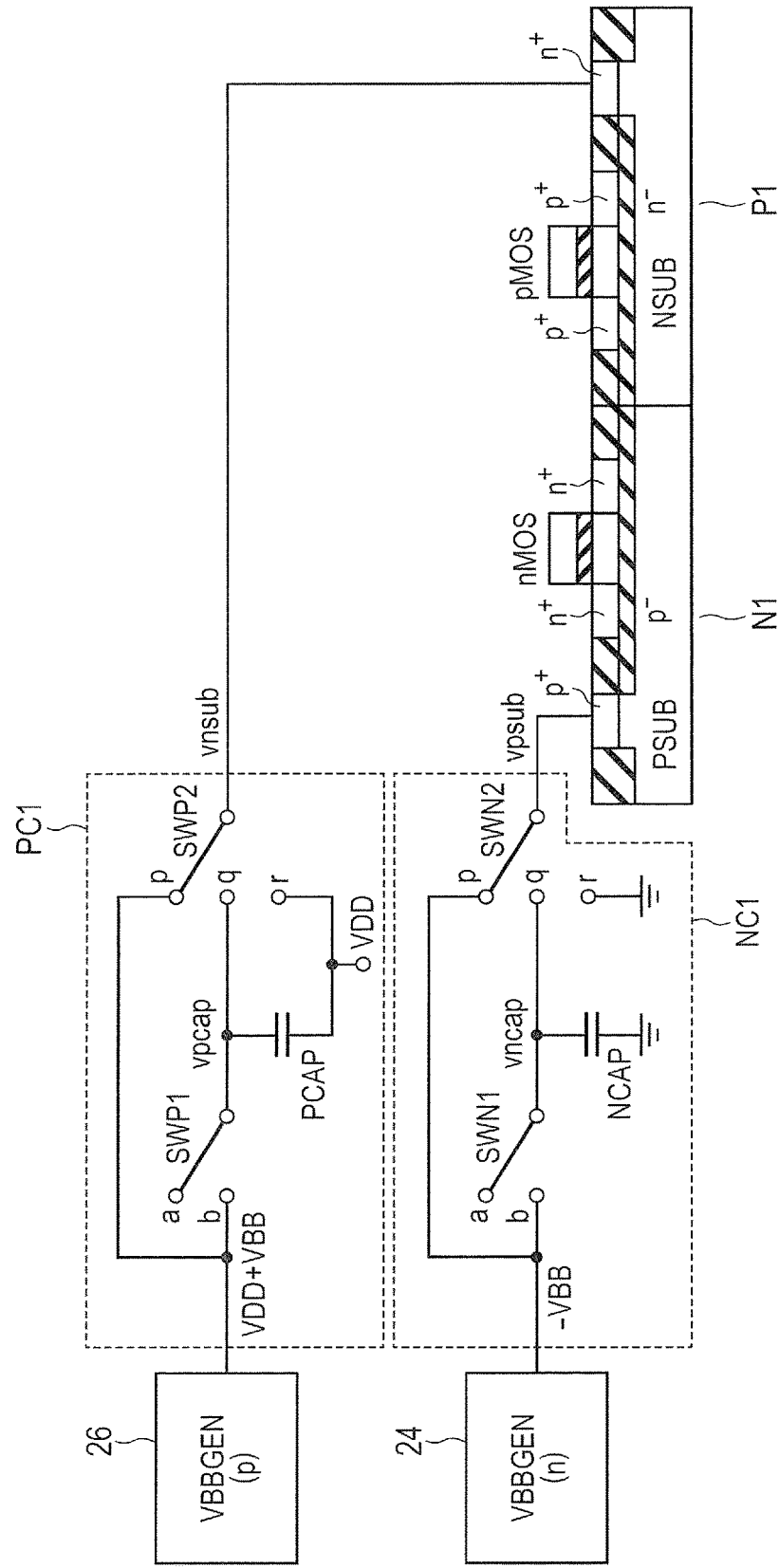
FIG. 12 is a diagram illustrating configurations of an N bias control circuit and P bias control circuit according to the second embodiment.

FIG. 12 is a diagram illustrating configurations of an N bias control circuit NC1 and P bias control circuit PC1 according to the second embodiment.

FIG. 12 shows a PMOS transistor P1 and an NMOS transistor N1, which respectively represent plural PMOS transistors and NMOS transistors included in plural circuit blocks of the semiconductor device.

The N bias control circuit NC1 is disposed between the VBBGEN (n) 24 and the substrate PSUB of the NMOS transistor N1. The P dial control circuit PC1 is disposed between the VBBGEN(p) 26 and the substrate NSUB of the PMOS transistor P1. The N bias control circuit NC1 and the P bias control circuit PC1 simultaneously operate.

The N bias control circuit NC1 includes a switch SWN1, a capacitor NCAP, and a switch SWN2.

The switch SWN1 couples a node vncap to either a terminal a or a terminal b. The terminal a is open. The terminal b is coupled to the output of the NMOS back bias generation circuit 24.

The capacitor NCAP is disposed between the node vncap and the ground GND.

The switch SWN2 is couples the substrate PSUB to one of a terminal p, a terminal q, and a terminal r. The terminal p is coupled to the output of the VBBGEN(n) 24. The terminal q is coupled to the node vncap. The terminal r is coupled to the ground GND.

The P bias control circuit PC1 includes a switch SWP1, a capacitor PCAP, and a switch SWP2.

The switch SWP1 couples a node vpcap to either the terminal a or the terminal b. The terminal a is open. The terminal b is coupled to the output of the PMOS back bias generation circuit 26.

The capacitor PCAP is disposed between the node vpcap and the ground GND.

The switch SWP2 couples the substrate NSUB to one of the terminal p, the terminal q, and the terminal r. The terminal p is coupled to the output of the PMOS back bias generation circuit 26. The terminal q is coupled to the node vpcap. The terminal r is coupled to the ground GND.

For the sake of simplicity, it is assumed that the capacitance of the capacitor PCAP is equal to the parasitic capacitance of the substrate NSUB, and that the capacitance of the capacitor NCAP is equal to the parasitic capacitance of the substrate PSUB. The voltages of the substrate PSUB and substrate NSUB can be rapidly changed by the capacitor NCAP and the capacitor PCAP.

Figure 13:
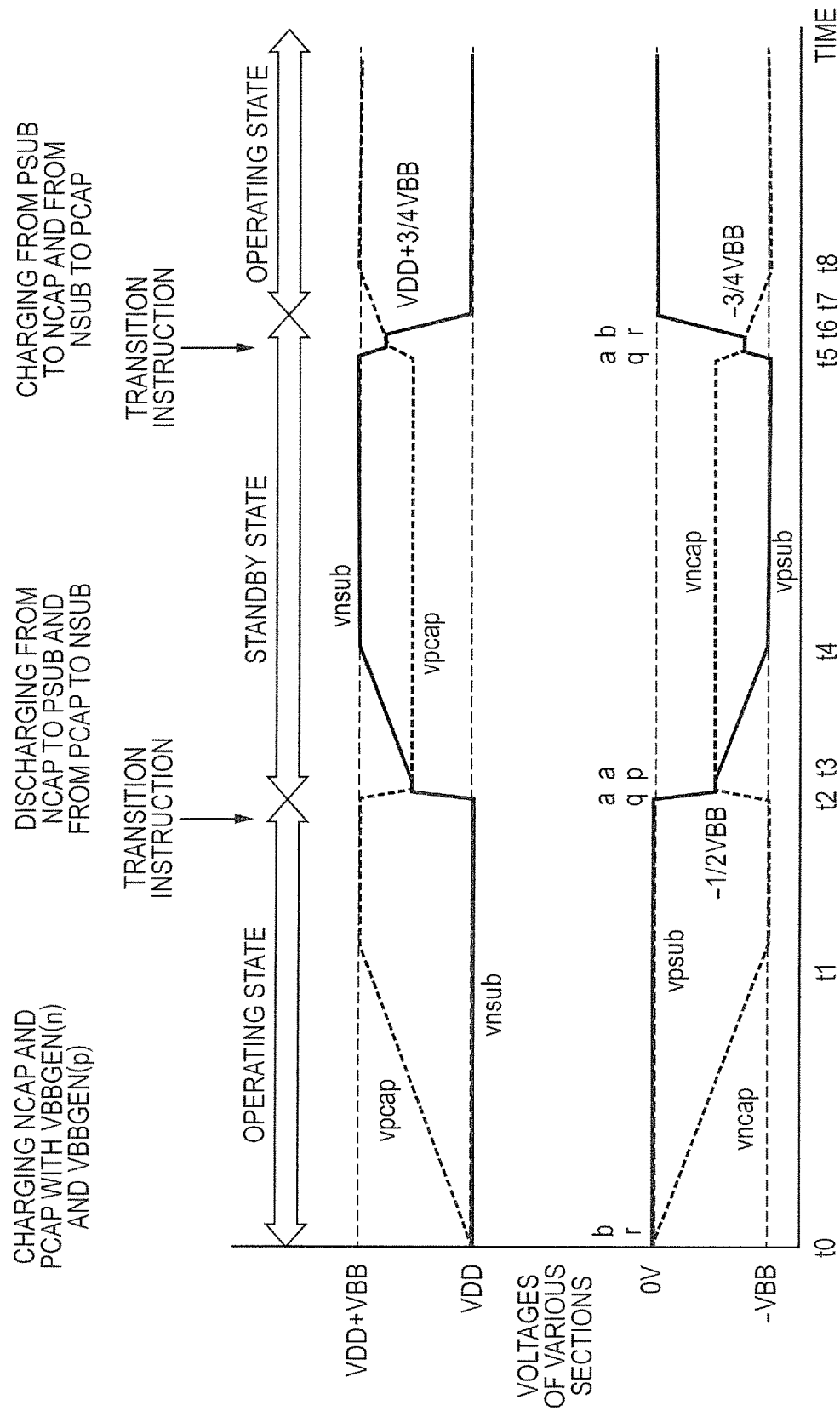
FIG. 13 is a timing diagram illustrating operations of the circuits shown in FIG. 12.

FIG. 13 is a timing diagram illustrating operations of the circuits shown in FIG. 12.

It is assumed that the output voltage of the VBBGEN(n) 24 is always −VBB, and that the output voltage of the VBBGEN (p) 26 is always (VDD+VBB).

It is assumed that, in an initial state at time t0, the circuit blocks in the semiconductor device are in the operating state, and that the voltages of the substrate PSUB and capacitor NCAP are both equal to a ground voltage of 0 V, and further that the voltages of the substrate NSUB and capacitor PCAP are both equal to the power supply voltage VDD.

When the CPU core 12 sets the switch SWN1 and switch SWP1 to b, the VBBGEN (n) 24 is coupled to the capacitor NCAP, and the VBBGEN (p) 26 is coupled to the capacitor PCAP. When the CPU core 12 sets the switch SWN2 and switch SWP2 to r, the substrate PSUB is coupled to the ground GND, and the substrate NSUB is coupled to the power supply source VDD. As a result, the capacitor NCAP is gradually charged to −VBB although the voltage of the substrate PSUB remains at 0 V, and the capacitor PCAP is gradually charged to (VDD+VBB) although the voltage of the substrate NSUB remains at VDD. The time required for such charging is governed by the maximum output current of the VBBGEN(n) 24 and VBBGEN(p) 26.

When, at time t1, the voltage of the capacitor NCAP is −VBB and the voltage of the capacitor PCAP is (VDD+VBB), the VBBGEN(n) 24 and the VBBGEN(p) 26 automatically stop to terminate charging.

At time t2, the semiconductor device receives, from the outside, a transition instruction for transitioning from the operating mode to the standby mode. In this instance, the CPU core 12 sets the switch SWN1 and the switch SWP1 to a, and sets the switch SWN2 and the switch SWP2 to q. This uncouples the VBBGEN(n) 24 from the capacitor NCAP, uncouples the VBBGEN(p) 26 from the capacitor PCAP, couples the substrate PSUB to the capacitor NCAP, and couples the substrate NSUB to the capacitor PCAP. The substrate PSUB is then rapidly charged by a negative electrical charge stored in the capacitor NCAP so that the substrate PSUB is at the same voltage (−½*VBB) as the capacitor NCAP. Further, the substrate NSUB is rapidly charged by a positive electrical charge stored in the capacitor PCAP so that the substrate NSUB is at the same voltage (VDD+½*VBB) as the capacitor PCAP. The time required for such an operation is determined by the on-resistance of the switch SWN2 and switch SWP2 and the capacitance of the substrate PSUB, capacitor NCAP, substrate NSUB, and capacitor PCAP. However, the substrate PSUB and the substrate NSUB can be charged more rapidly by sufficiently decreasing the on-resistance of the switch SWN2 and switch SWP2 than when the substrate PSUB is charged by the VBBGEN(n) 24 and the substrate NSUB is charged by the VBBGEN(p) 26. In this instance, the voltage of the substrate PSUB is changed to a value half a target voltage (−½*VBB), and the voltage of the substrate NSUB is changed to a value half a target voltage (VDD+½*VBB). However, such change amounts will provide a sufficient effect of leakage current reduction because the substrate voltage dependence of a MOSFET leakage current exhibits the greatest change in the vicinity of 0 V as mentioned earlier.

When, at time t3, the CPU core 12 further sets the switch SWN1 and switch SWP1 to a and sets the switch SWN2 and switch SWP2 to p, the VBBGEN(n) 24 is coupled to the substrate PSUB, and the VBBGEN(p) 26 is coupled to the substrate NSUB. As a result, the substrate PSUB is gradually charged to (−VBB), and the substrate NSUB is gradually charged to (VDD+VBB).

When, at time t4, the voltage of the substrate PSUB is (−VBB) and the voltage of the substrate NSUB is (VDD+VBB), the VBBGEN(n) 24 and the VBBGEN(p) 26 automatically stop to terminate charging. The circuit blocks are then placed in the standby state.

At time t5, the semiconductor device receives, from the outside, a transition instruction for transitioning from the operating mode to the standby mode. The CPU core 12 sets the switch SWN1 and the switch SWP1 to a, and sets the switch SWN2 and the switch SWP2 to q. This recouples the substrate PSUB to the capacitor NCAP, and recouples the substrate NSUB to the capacitor PCAP. The negative electrical charge of the substrate PSUB is then rapidly regenerated to the capacitor NCAP so that the substrate PSUB is at the same voltage (−¾*VBB) as the capacitor NCAP. Further, the positive electrical charge in the substrate NSUB is rapidly regenerated to the capacitor PCAP so that the substrate NSUB is at the same voltage (VDD+¾*VBB) as the capacitor PCAP. The time required for such a regeneration operation is determined by the on-resistance of the switch SWN2 and switch SWP2 and the capacitance of the substrate PSUB, substrate NSUB, capacitor NCAP, and capacitor PCAP. Therefore, the regeneration operation is performed at the same high speed as the operation performed at time t2.

At time t6, the CPU core 12 further sets the switch SWN1 and switch SWP1 to b and sets the switch SWN2 and switch SWP2 to r.

The substrate PSUB is then rapidly discharged to 0 V, and the substrate NSUB is rapidly discharged to VDD. The time required for this discharge operation is determined by the on-resistance of the switch SWN2 and switch SWP2 and the capacitance of the substrate PSUB and substrate NSUB. Therefore, the discharge operation is also performed at high speed. Further, the capacitor NCAP is recoupled to the VBBGEN(n) 24 and gradually charged to (−VBB), and the capacitor PCAP is recoupled to the VBBGEN(p) 26 and gradually charged to (VDD+VBB).

When, at time t7, the substrate PSUB is discharged to 0 V, and the substrate NSUB is discharged to VDD, the circuit blocks are placed in the operating state.

When, at time t8, the voltage of the capacitor NCAP is (−VBB), and the voltage of the capacitor PCAP is (VDD+ VBB), the VBBGEN(n) 24 and the VBBGEN(p) 26 automatically stop to terminate charging.

The state at time t8 is the same as the state at time t1. Subsequently, a cycle formed of states at time t1 to time t8 is repeated for processing purposes.

At time t5, the substrate PSUB regenerates an electrical charge to the capacitor NCAP, and the substrate NSUB regenerates an electrical charge to the capacitor PCAP. The present embodiment will now be compared with a case where electrical power generated, for example, by a motor is regenerated to a capacitor. In this case, as the motor generates electromotive force, an electrical charge can be regenerated even if there is no potential difference between the motor and the capacitor. In the present embodiment, however, the substrate PSUB and the substrate NSUB are passive elements and do not generate electromotive force. Therefore, the present embodiment uncouples the substrate PSUB from the capacitor NCAP and the substrate NSUB from the capacitor PCAP during a period between time t3 and time t5 in order to generate a potential difference between the substrates and the capacitors. In this manner, the present embodiment achieves regeneration.

As described above, in order to charge the substrate PSUB and the substrate NSUB during transition to the standby state at time t2, the present embodiment uses the capacitor NCAP and capacitor PCAP and not the VBBGEN(n) 24 and VBBGEN(p) 26. Therefore, charging can be rapidly accomplished without regard to the current drive capability of the VBBGEN(n) 24 and VBBGEN(p) 26. Further, at time t5, the electrical charge of the substrate PSUB is regenerated to the capacitor NCAP, and the electrical charge of the substrate NSUB is regenerated to the capacitor PCAP. This reduces the power consumption of the VBBGEN(n) 24 and VBBGEN(p) 26.

Electrical power of the VBBGEN(n) 24 will now be described.

When the VBBGEN(n) 24 is assumed to be a general charge pump circuit, the internal voltage of the VBBGEN(n) 24 remains at (−VBB) irrespective of the voltage of a charge target (e.g., the capacitor NCAP). Therefore, an energy equivalent to the difference between the internal voltage and the voltage of the capacitor NCAP is consumed by the switch SWN1, which couples the VBBGEN(n) 24 to the capacitor NCAP. If, for example, the capacitance of the capacitor NCAP is Ccap in a case where the capacitor NCAP is to be charged from 0 V to (−VBB), the electrical power P1 outputted from the VBBGEN(n) 24 and the electrical power P2 stored in the capacitor NCAP are expressed by the equation below.

$$P1 = Ccap \ast VBB^2$$

$$P2 = (\tfrac{1}{2}) \ast Ccap \ast VBB^2$$

The electrical power outputted from the VBBGEN(n) 24 is two times the electrical power stored in the capacitor NCAP. Half the electrical power outputted from the VBBGEN(n) 24 is consumed by the wiring resistance between the capacitor NCAP and the VBBGEN(n) 24.

It is assumed that the power efficiency Effb of the VBBGEN(n) 24 is constant, namely, its internal loss is proportional to its electrical power output. The power consumption of the VBBGEN(n) 24 operating as indicated in the timing diagram of FIG. 13 is P3 between time t0 and time t1, P4 between time t3 and time t4, and P5 between time t6 and time t8.

$$P3 = Ccap \ast VBB^2 / \mathit{Effb}$$

$$P4 = (\tfrac{1}{2}) \ast Ccap \ast VBB^2 / \mathit{Effb}$$

$$P5 = (\tfrac{1}{4}) \ast Ccap \ast VBB^2 / \mathit{Effb}$$

That is to say, the present embodiment consumes an electrical power of P3 during an initial interval between time t0 and time t1, but consumes an electrical power of P6 during a subsequent cycle between time t1 and time t8.

$$P6 = (\tfrac{3}{4}) \ast Ccap \ast VBB^2 / \mathit{Effb}$$

Meanwhile, a related-art method consumes an electrical power of P3 during each cycle. Therefore, the power consumption of the VBBGEN(n) 24 according to the present embodiment is reduced to three-fourths the power consumption during the use of the related-art method. The reason is that a regenerative operation is performed at time t5.

The power consumption of the VBBGEN(p) 26 can also be reduced to three-fourths the power consumption during the use of the related-art method.

Third Embodiment

Although the following only describes how the back bias voltage of the NMOS transistor N1 is controlled, the back bias voltage of the PMOS transistor P1 can be controlled in the same manner as described below.

Figure 14:
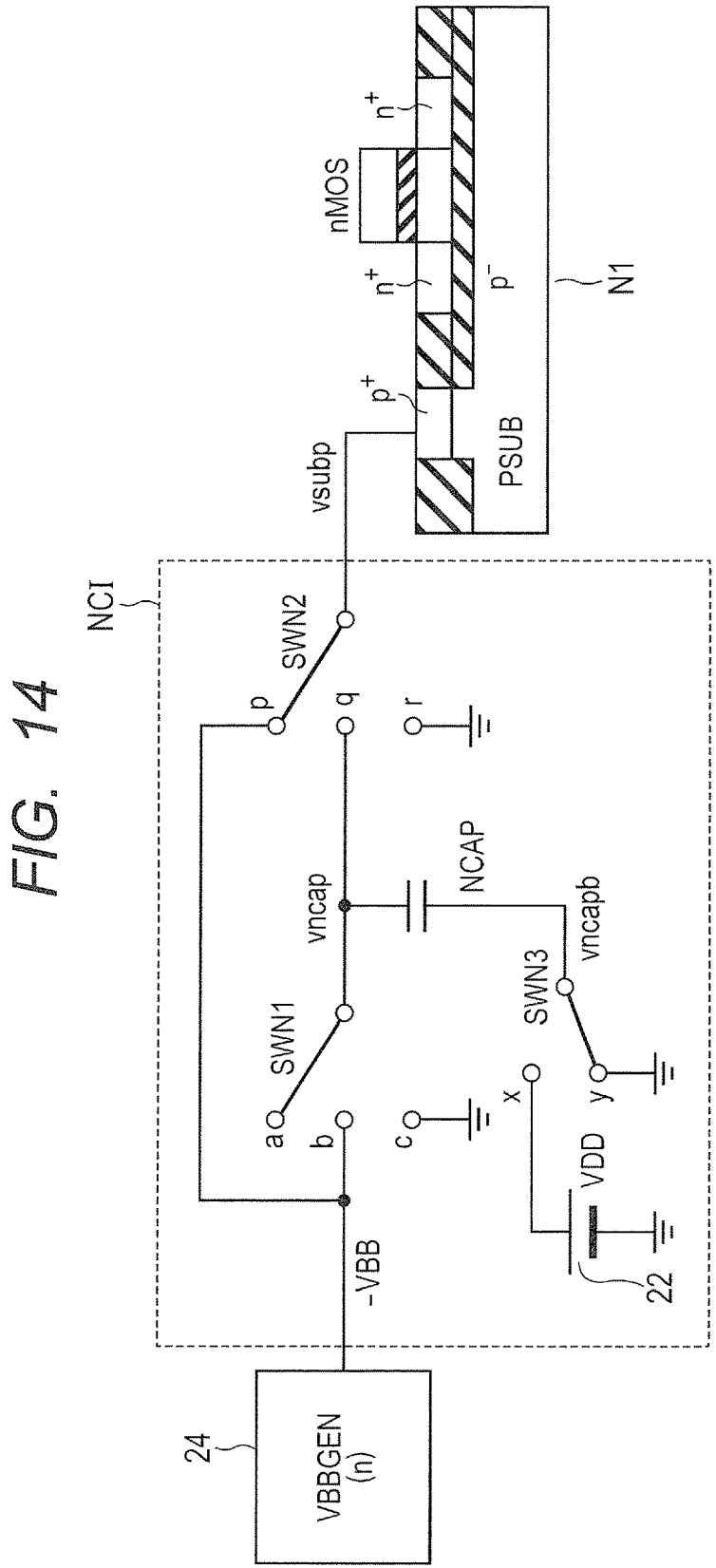
FIG. 14 is a diagram illustrating a configuration of the N bias control circuit according to a third embodiment of the present invention.

FIG. 14 is a diagram illustrating a configuration of the N bias control circuit NC1 according to a third embodiment of the present invention.

FIG. 14 shows an NMOS transistor N1 that represents plural NMOS transistors included in plural circuit blocks of the semiconductor device.

The N bias control circuit NC1 is disposed between the VBBGEN (n) 24 and the substrate PSUB of the NMOS transistor N1.

The N bias control circuit NC1 includes the switch SWN1, the capacitor NCAP, the switch SWN2, and a switch SWN3.

The switch SWN1 couples the node vncap to one of the terminal a, the terminal b, and a terminal c. The terminal a is open. The terminal b is coupled to the output of the VBBGEN (n) 24. The terminal c is coupled to the ground GND.

The capacitor NCAP is disposed between the node vncap and a node vncapb.

The switch SWN2 is couples the substrate PSUB to one of the terminal p, the terminal q, and the terminal r. The terminal p is coupled to the output of the VBBGEN(n) 24. The terminal q is coupled to the node vncap. The terminal r is coupled to the ground GND.

The switch SWN3 couples the node vncapb to either a terminal x or a terminal y. The terminal x is coupled to the VDD supply source 22. The terminal y is coupled to the ground GND.

For the sake of simplicity, it is assumed that the capacitance of the capacitor NCAP is equal to the parasitic capacitance of the substrate PSUB. The voltage of the node vncapb is allowed to transition between the ground GND and the VDD in order to let the capacitor NCAP function as a charge pump in place of the VBBGEN(n) 24.

Figure 15:
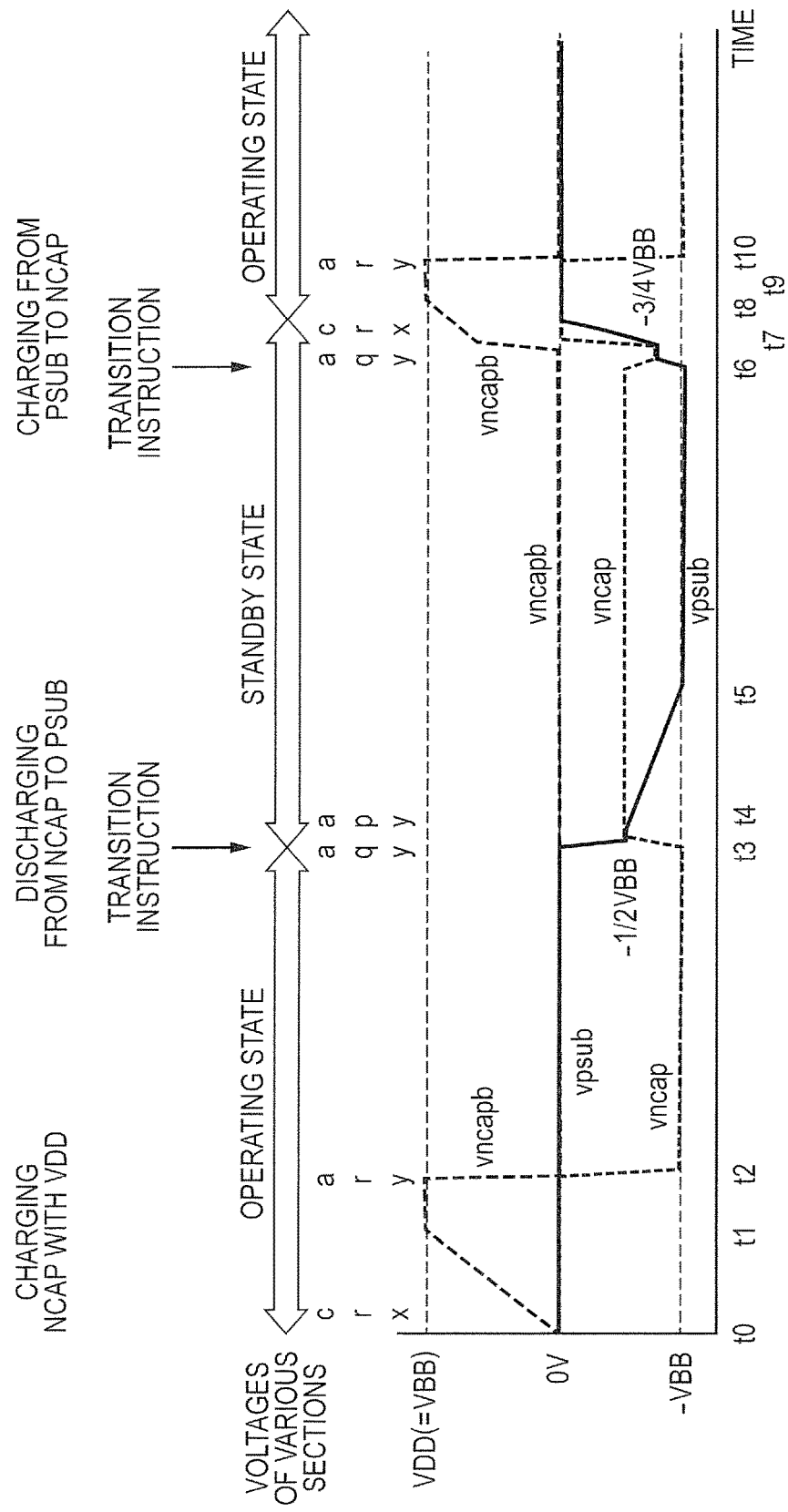
FIG. 15 is a timing diagram illustrating an exemplary operation of the circuit shown in FIG. 14.

FIG. 15 is a timing diagram illustrating an exemplary operation of the circuit shown in FIG. 14.

It is assumed that the output voltage (−VBB) of the VBBGEN(n) 24 is equal to (−VDD).

It is assumed that, in an initial state at time t0, the circuit blocks in the semiconductor device are in the operating state, and that the voltages of the substrate PSUB and capacitor NCAP are both equal to a ground voltage of 0 V.

When the CPU core 12 sets the switch SWN1 to c, the switch SWN2 to r, and the switch SWN3 to x, the capacitor NCAP is coupled to the VDD supply source 22, and the substrate PSUB is coupled to the ground GND. This causes the voltage of the substrate PSUB to remain at 0 V, but gradually charges the capacitor NCAP to VDD. The time required for such charging is governed by the maximum output current of the VBBGEN(n) 24 and VBBGEN(p) 26. The time required for such charging is governed by the output current of the VDD supply source 22. In general, the positively-biased VDD supply source 22 is higher than the negatively-biased VBBGEN(n) 24 in current supply capacity and power efficiency. Therefore, the present embodiment is capable of charging the capacitor NCAP at higher speed and lower power consumption than the second embodiment.

When, at time t1, the voltage of the node vncapb is VDD, charging terminates.

At time t2, the CPU core 12 switch sets the switch SWN1 to a, the switch SWN2 to r, and the switch SWN3 to y. This sets the voltage of the node vncapb to 0 V and the voltage of the node vncap to (−VBB) while maintaining the electrical charge of the capacitor NCAP.

At time t3, the semiconductor device receives, from the outside, a transition instruction for transitioning from the operating mode to the standby mode. In this instance, the CPU core 12 sets the switch SWN1 to a, the switch SWN2 to q, and the switch SWN3 to y. This couples the substrate PSUB to the capacitor NCAP. The negative electrical charge of the capacitor NCAP then rapidly charges the substrate PSUB so that the voltages of the substrate PSUB and capacitor NCAP are (−½)*VBB. The time required for such charging is determined by the on-resistance of the switch SWN2 and the capacitance of the substrate PSUB and capacitor NCAP. However, when the on-resistance of the switch SWN2 is decreased to a sufficiently low level, the substrate PSUB can be charged at higher speed than when it is charged by the VBBGEN(n). In this instance, the voltage of the substrate PSUB is changed to a value half a target voltage, that is, (−½) *VBB. However, such a change amount will provide a sufficient effect of leakage current reduction because the substrate PSUB voltage dependence of a MOSFET leakage current exhibits the greatest change in the vicinity of 0 V.

When, at time t4, the CPU core 12 sets the switch SWN1 to a, the switch SWN2 to p, and the switch SWN3 to y, the VBBGEN(n) 24 is coupled to the substrate PSUB. The substrate PSUB is then gradually charged to (−VBB).

When, at time t5, the voltage of the substrate PSUB is equal to VBB, the VBBGEN(n) 24 automatically stops to terminate charging. This places the circuit blocks in the standby state.

At time t6, the semiconductor device receives, from the outside, a transition instruction for transitioning from the standby mode to the operating mode. When the CPU core 12 sets the switch SWN1 to a, the switch SWN2 to q, and the switch SWN3 to y, the substrate PSUB is recoupled to the capacitor NCAP. The negative electrical charge of the substrate PSUB is then rapidly regenerated to the capacitor NCAP so that the substrate PSUB and the capacitor NCAP are at the same voltage, that is, (−¾)*VBB. The time required for such a regeneration operation is determined by the on-resistance of the switch SWN2 and the capacitance of the substrate PSUB and capacitor NCAP. Therefore, the regeneration operation is performed at the same high speed as the operation performed at time t2.

At time t7, the CPU core 12 further sets the switch SWN1 to c, the switch SWN2 to r, and the switch SWN3 to x. The substrate PSUB is then rapidly discharged to 0 V. The time required for this discharge operation is determined by the on-resistance of the switch SWN2 and the capacitance of the substrate PSUB. Therefore, the discharge operation is also performed at high speed. Further, the node vncap is coupled to the ground GND, and the node vncapb is coupled to the VDD supply source 22 and charged again to VDD.

When, at time t8, the substrate PSUB is discharged to 0 V, the circuit blocks in the semiconductor device are placed in the operating state.

When, at time t9, the voltage of the node vncapb is VDD, charging of the capacitor NCAP terminates.

At time t10, the CPU core 12 further sets the switch SWN1 to a, the switch SWN2 to r, and the switch SWN3 to y. This again sets the voltage of the node vncapb to 0 V and the voltage of the node vncap to (−VBB) while maintaining the electrical charge of the capacitor NCAP.

The state at time t10 is the same as the state at time t2. Subsequently, a cycle formed of states at time t2 to time t10 is repeated for processing purposes.

Electrical power of the back bias voltage will now be described, as is the case with the second embodiment. In this instance, the electrical power of the VDD supply source 22 is taken into consideration in addition to the electrical power of the VBBGEN(n) 24. The VDD supply source 22, which supplies a positive bias, is higher in efficiency than the VBBGEN(n). Here, it is assumed that the efficiency of the VDD supply source 22 is Effd. It should be noted that Effd>Effb.

The power consumption of the VBBGEN (n) 24 and VDD supply source 22 during an operation indicated in the timing diagram of FIG. 15 is P7 between time t0 and time t1, P8 between time t4 and time t5, and P9 between time t7 and time t9.

$$P7 = Ccap * VDD^2 / Effd$$

$$P8 = (½) * Ccap * VBB^2 / Effb$$

$$P9 = (¼) * Ccap * VDD^2 / Effd$$

That is to say, as Effd>Effb and VDD=VBB, P7 is lower than P1 in the second embodiment during an initial interval between time t0 and time t1, and the power consumption P10 is lower than P6 in the second embodiment during a subsequent cycle between time t2 and time t10.

$$P10 = Ccap * VBB^2 * ((½) * Effb + (¼) * Effd)$$

As described above, the present embodiment achieves charging by using a highly efficient VDD supply source.

Thus, the present embodiment reduces the power consumption to a lower level than the second embodiment.

Fourth Embodiment

Figure 16:
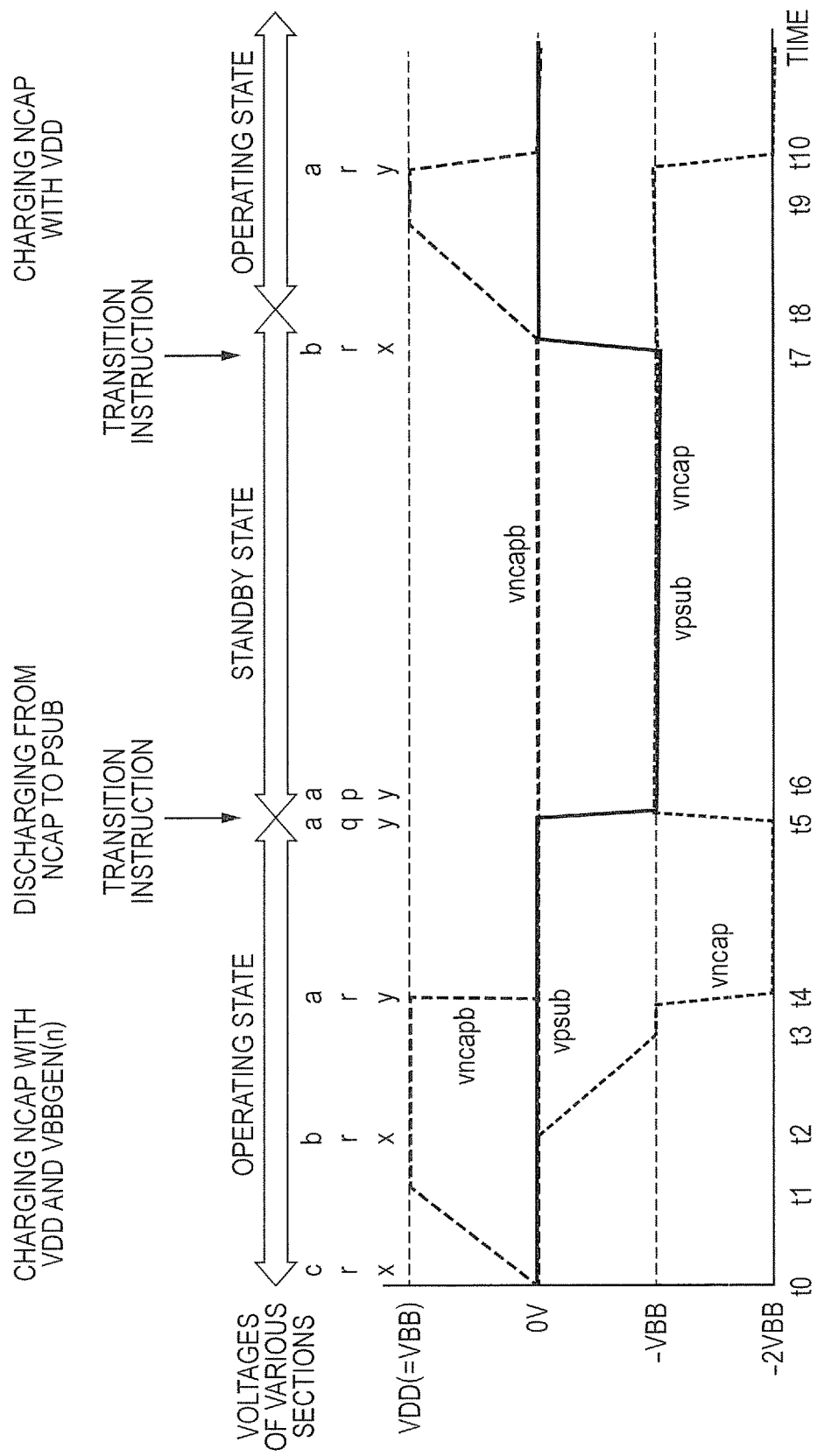
FIG. 16 is a timing diagram illustrating another exemplary operation of the circuit shown in FIG. 14.

FIG. 16 is a timing diagram illustrating another exemplary operation of the circuit shown in FIG. 14.

Here, it is assumed that the output voltage (−VBB) of the VBBGEN(n) 24 is equal to (−VDD), as is the case with the third embodiment.

At time t0, the circuit blocks in the semiconductor device are assumed to be in the operating state, and the voltages of the substrate PSUB and capacitor NCAP are assumed to be both equal to a ground voltage of 0 V.

When the CPU core 12 sets the switch SWN1 to c, the switch SWN2 to r, and the switch SWN3 to x, the VDD supply source 22 is coupled to the capacitor NCAP, and the substrate PSUB is coupled to the ground GND. This causes the voltage of the substrate PSUB to remain at 0 V, but gradually charges the node vncapb to VDD. The time required for such charging is governed by the maximum output current of the VDD supply source 22. In general, the positively-biased VDD supply source 22 is higher than the negatively-biased VBBGEN(n) in current supply capacity and power efficiency. Therefore, the present embodiment is capable of charging the capacitor NCAP at higher speed and lower power consumption than the second embodiment.

When, at time t1, the voltage of the node vncapb is VDD, charging terminates.

At time t2, the CPU core 12 switch sets the switch SWN1 to b. This charges the node vncap to (−VBB).

When, at time t3, the voltage of the node vncap is (−VBB), charging terminates. As a result, a voltage of 2*VDD is stored across the capacitor NCAP, that is, between the node vncapb and the node vncap.

At time t4, the CPU core 12 couples the switch SWN1 to a and couples the switch SWN3 to y. As a result, the voltage of the node vncap is (−2*VBB).

At time t5, the semiconductor device receives, from the outside, a transition instruction for transitioning from the operating mode to the standby mode. In this instance, the CPU core 12 couples the switch SWN1 to a, couples the switch SWN2 to q, and couples the switch SWN3 to y. This couples the substrate PSUB to the capacitor NCAP. The negative electrical charge of the capacitor NCAP then rapidly charges the substrate PSUB so that the substrate PSUB and the capacitor NCAP are at the same voltage, that is, (−VBB). The time required for such a charging operation is determined by the on-resistance of the switch SWN2 and the capacitance of the substrate PSUB and capacitor NCAP. However, when the on-resistance of the switch SWN2 is decreased to a sufficiently low level, the substrate PSUB can be charged at higher speed than when it is charged by the VBBGEN (n) 24. In marked contrast to the second and third embodiments, the present embodiment is capable of charging the substrate PSUB to (−VBB) by using only an electrical charge from the capacitor NCAP. This further increases the speed of possible voltage change in the substrate PSUB. As a result, the present embodiment produces a significant leakage current reduction effect.

When, at time t6, charging terminates, the CPU core 12 couples the switch SWN1 to a, couples the switch SWN2 to p, and couples the switch SWN3 to y. This uncouples the substrate PSUB from the capacitor NCAP and couples the substrate PSUB to the VBBGEN(n) 24.

At time t7, the semiconductor device receives, from the outside, a transition instruction for transitioning from the standby mode to the operating mode. The CPU core 12 then couples the switch SWN1 to b, couples the switch SWN2 to r, and couples the switch SWN3 to x. This rapidly discharges the substrate PSUB to 0 V while at the same time charging the node vncapb to VDD.

When, at time t8, the substrate PSUB is discharged to 0 V, the circuit blocks in the semiconductor are placed in the operating state.

At time t9, the node vncapb is charged to VDD.

At time t10, the CPU core 12 couples the switch SWN1 to a, couples the switch SWN2 to r, and couples the switch SWN3 to y. This again sets the voltage of the node vncapb to 0 V and the voltage of the node vncap to (−2*VBB) while maintaining the electrical charge of the capacitor NCAP.

The state at time t10 is the same as the state at time t4. Subsequently, a cycle formed of states at time t4 to time t10 is repeated for processing purposes.

In marked contrast to the second and third embodiments, the present embodiment stores two times the VDD voltage in the capacitor NCAP at time t5, and thus is capable of changing the voltage of the substrate PSUB to (−VBB) by using only the electrical charge of the capacitor NCAP. As a result, the present embodiment produces a greater leakage current reduction effect than the second and third embodiments.

Fifth Embodiment

Figure 17:
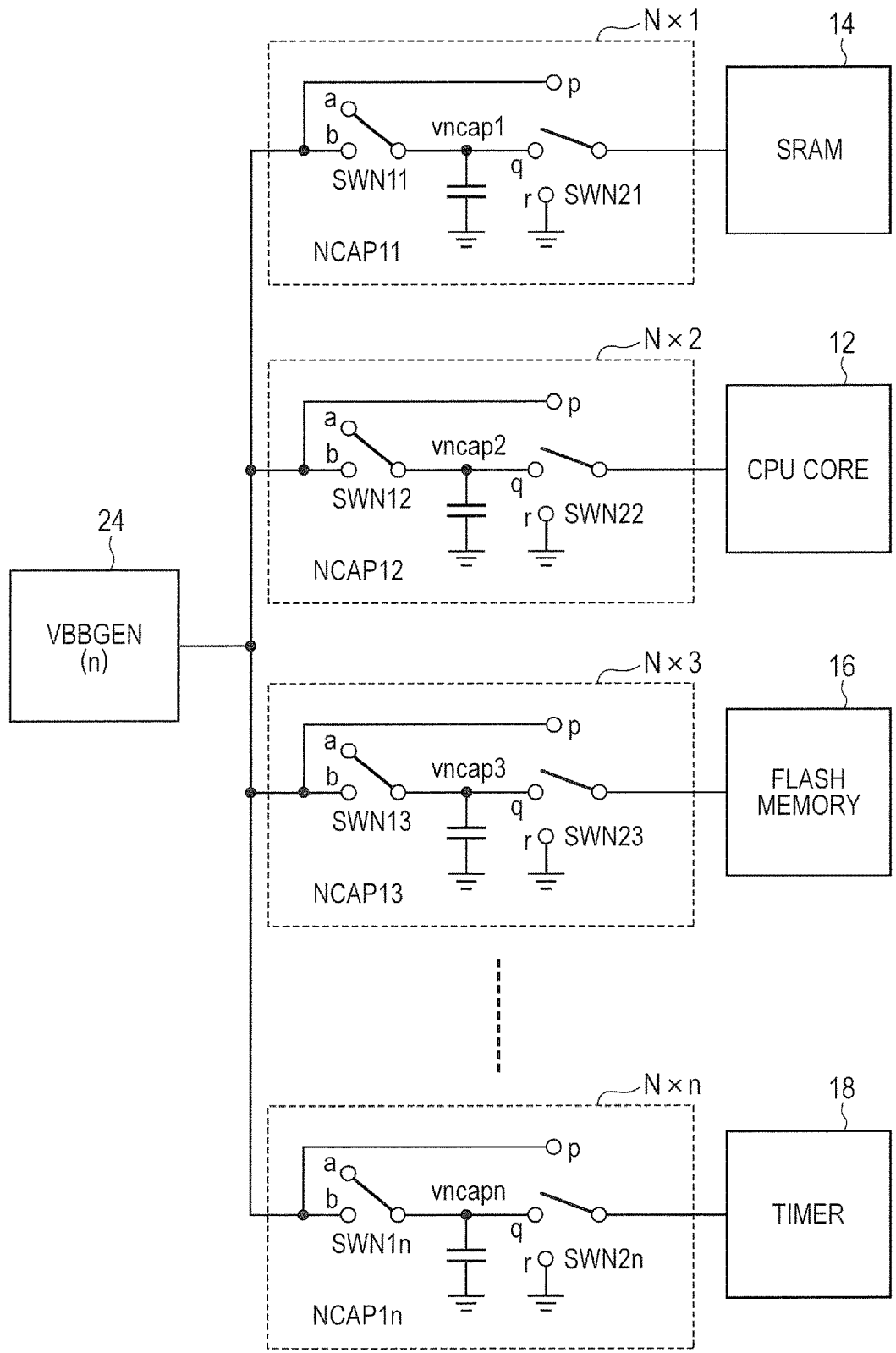
FIG. 17 is a diagram illustrating a bias control circuit according to a fifth embodiment of the present invention.

FIG. 17 is a diagram illustrating a bias control circuit according to a fifth embodiment of the present invention.

In the fifth embodiment, a bias control circuit having a capacitor is provided for each functional block in a semiconductor chip. The functional blocks are, for example, the CPU 12, the SRAM 14, the flash memory 16, and the timer 18.

The semiconductor device includes bias control circuits NX1, NX2, NX3, NXn for the CPU core 12, the SRAM 14, the flash memory 16, and the timer 18, respectively.

The bias control circuit NX1 includes a switch SWN11, a capacitor NCAP11, and a switch SWN21.

The switch SWN11 couples a node vncap1 to either the terminal a or the terminal b. The terminal a is open. The terminal b is coupled to the output of the VBBGEN(n) 24. The capacitor NCAP11 is disposed between the node vncap1 and the ground GND. The switch SWN21 couples the substrate PSUB of the NMOS transistor in the SRAM 14 to one of the terminal p, the terminal q, and the terminal r. The terminal p is coupled to the output of the VBBGEN(n) 24. The terminal q is coupled to the node vncap1. The terminal r is coupled to the ground GND.

The bias control circuit NX2 includes a switch SWN12, a capacitor NCAP12, and a switch SWN22.

The switch SWN12 couples a node vncap2 to either the terminal a or the terminal b. The terminal a is open. The terminal b is coupled to the output of the VBBGEN(n) 24. The capacitor NCAP12 is disposed between the node vncap2 and the ground GND. The switch SWN22 couples the substrate PSUB of the NMOS transistor in the CPU core 12 to one of the terminal p, the terminal q, and the terminal r. The terminal p is coupled to the output of the VBBGEN(n) 24. The terminal q is coupled to the node vncap2. The terminal r is coupled to the ground GND.

The bias control circuit NX3 includes a switch SWN13, a capacitor NCAP13, and a switch SWN23.

The switch SWN13 couples a node vncap3 to either the terminal a or the terminal b. The terminal a is open. The terminal b is coupled to the output of the VBBGEN(n) 24.

The capacitor NCAP13 is disposed between the node vncap3 and the ground GND. The switch SWN23 couples the substrate PSUB of the NMOS transistor in the flash memory 16 to one of the terminal p, the terminal q, and the terminal r. The terminal p is coupled to the output of the VBBGEN(n) 24. The terminal q is coupled to the node vncap3. The terminal r is coupled to the ground GND.

The bias control circuit NXn includes a switch SWN1n, a capacitor NCAP1n, and a switch SWN2n.

The switch SWN1n couples a node vncapn to either the terminal a or the terminal b. The terminal a is open. The terminal b is coupled to the output of the VBBGEN (n) 24. The capacitor NCAP1n is disposed between the node vncapn and the ground GND. The switch SWN2n couples the substrate PSUB of the NMOS transistor in the flash memory 16 to one of the terminal p, the terminal q, and the terminal r. The terminal p is coupled to the output of the VBBGEN(n) 24. The terminal q is coupled to the node vncapn. The terminal r is coupled to the ground GND.

The VBBGEN (n) 24 is commonly provided for the functional blocks 16, 12, 14, 18 to output a bias voltage (−VBB).

Each of the bias control circuits NX1-NXn controls the associated circuit block in a manner described in conjunction with the second, third, or fourth embodiment. Such control includes at least the processes described below.

When the associated circuit block is selected, the bias control circuits NX1-NXn each store an electrical charge supplied from the VBBGEN (n) 24 while the associated circuit block is in the operating mode. When the associated circuit block transitions from the operating mode to the standby mode, the bias control circuits NX1-NXn each supply the stored electrical charge to the substrate of a MOSFET included in the associated circuit block, and then cause the VBBGEN(n) 24 to supply its output to the substrate. The bias control circuits NX1-NXn are assigned different priorities and selected according to the assigned priorities.

If plural power supply domains are included in the chip and can be turned on/off and set to different power supply voltage settings, it is preferable that each power supply domain be provided with its own capacitor.

Referring to FIG. 13, the capacitors NCAP, PCAP are charged by the VBBGEN(n) 24 and the VBBGEN(p) 26 during a period between time t0 and time t1. However, a significant amount of time is required for such charging due to a limited drive capability of the VBBGEN(n) 24 and VBBGEN(p) 26. Even if the capacitor NCAP is coupled to the substrate PSUB with the capacitor PCAP coupled to the substrate NSUB at a time point earlier than time t1 when the capacitors NCAP, PCAP are incompletely charged as indicated in FIG. 13, the above-mentioned effect of the foregoing embodiments cannot be fully produced because the amount of voltage change in each of the substrates PSUB, NSUB is small.

In view of the above circumstances, the present embodiment uses a unique capacitor for each block, and assigns different priorities to the blocks to charge the capacitors in order from the highest-priority block to the lowest. Therefore, only high-priority blocks can be rapidly charged. The electrical charges of the substrates are regenerated to the capacitors at the same time without regard to the priorities.

Leakage current in the standby state causes a problem for some functional blocks on the chip and causes no problem for the other functional blocks. The leakage current in the standby state causes no problem for functional blocks that have a small overall leakage current or do not need to enter the standby state because power can be shut off from an entire functional block although the leakage current is large.

The functional blocks shown in FIG. 17 have the characteristics described below.

The SRAM 14 has a large leakage current because it stores data and cannot be shut off from power. The flash memory 16 can be shut off from power. The CPU core 12 includes a small amount of SRAM, but the major part of the CPU core 12 can be shut off from power. The timer 18 has a small leakage current.

As is obvious from the above, the highest priority is assigned to the reduction of leakage current of the SRAM 14. Consequently, the capacitor NCAP11 coupled to the SRAM 14 should be preferentially charged.

Figure 18:
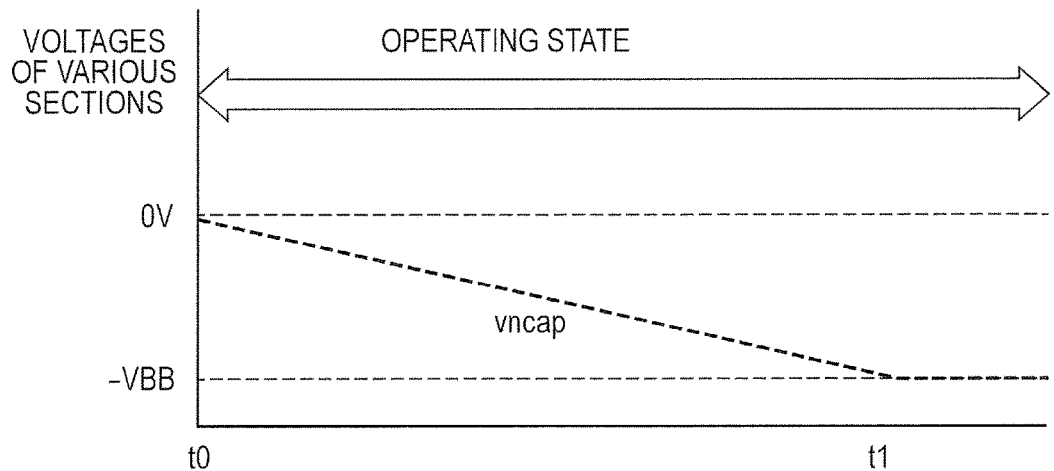
FIG. 18 is a diagram illustrating temporal voltage changes that occur in a node vncapn when a capacitor common to all blocks is charged.

FIG. 18 is a diagram illustrating temporal voltage changes that occur in the node vcapn when a capacitor common to all blocks is charged.

More specifically, FIG. 18 illustrates voltage changes in the node vncap coupled to one end of the capacitor NCAP when the capacitor NCAP included in a bias control circuit coupled to all the functional blocks is charged.

Figure 19:
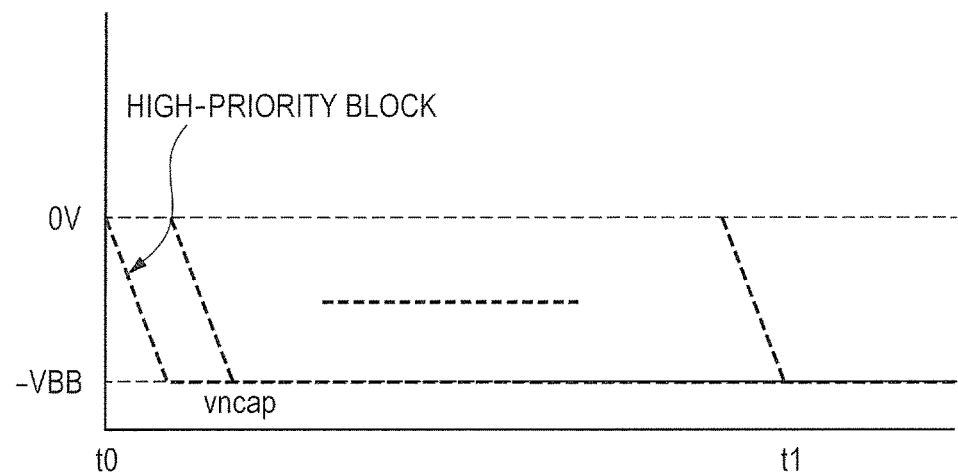
FIG. 19 is a diagram illustrating temporal voltage changes that occur in a node vncap when capacitors for individual functional blocks are sequentially charged.

FIG. 19 is a diagram illustrating temporal voltage changes that occur in the node vncap when capacitors for individual functional blocks are sequentially charged.

More specifically, FIG. 19 illustrates voltage changes in the node vncap coupled to one end of the capacitor NCAP when the capacitor NCAP included in a bias control circuit coupled to a selected functional block is charged. The functional blocks are sequentially selected in order from the highest-priority functional block to the lowest.

In general, the capacitance of the substrate of a SRAM is not higher than 1/10 the capacitance of a whole chip. Therefore, the time required for charging a capacitor coupled to a SRAM according to the present embodiment can be reduced to 1/10 or less the time required for charging a capacitor commonly coupled to all the blocks.

Figure 20:
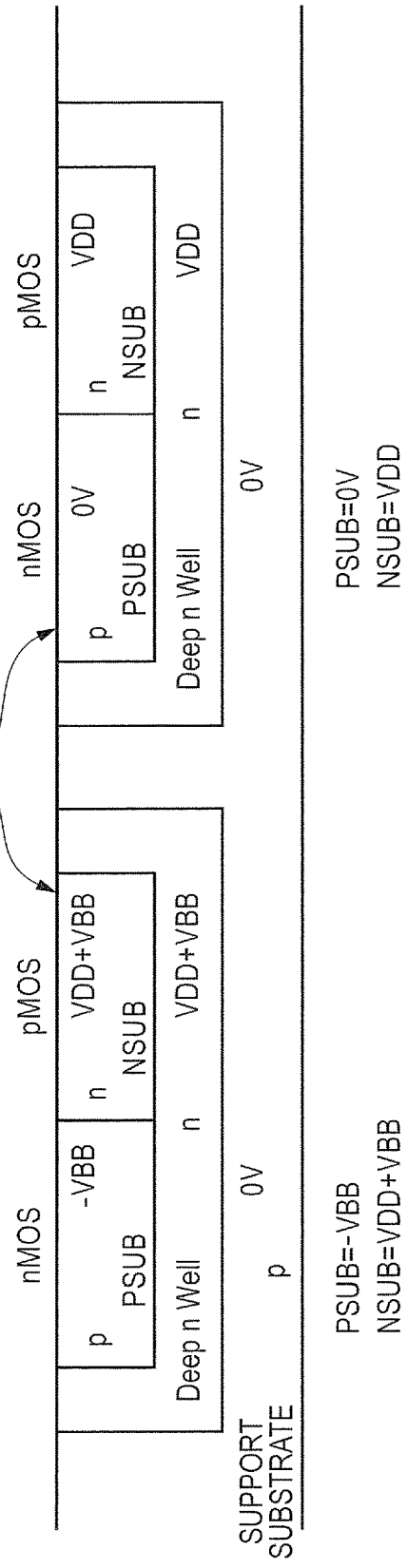
FIG. 20 is a diagram illustrating an exemplary cross-sectional structure of a substrate for applying different bias voltages to various functional blocks within a chip.

FIG. 20 is a diagram illustrating an exemplary cross-sectional structure of a substrate for applying different bias voltages to the functional blocks within the chip.

A P-type support substrate is used. Plural deep n-wells separated into the individual functional blocks are disposed in the P-type support substrate.

A voltage of (VDD+VBB) is applied to a deep n-well in a left block shown in FIG. 20. The back bias voltages applied to the NMOS transistor and the PMOS transistor are (−VBB) and (VDD+VBB), respectively.

A voltage of VDD is applied to a deep n-well in a right block shown in FIG. 20. The back bias voltages applied to the NMOS transistor and the PMOS transistor are 0 V and VDD, respectively.

As described above, different back bias voltage regions can be set on the same support substrate by using the deep n-wells.

Sixth Embodiment

Figure 21:
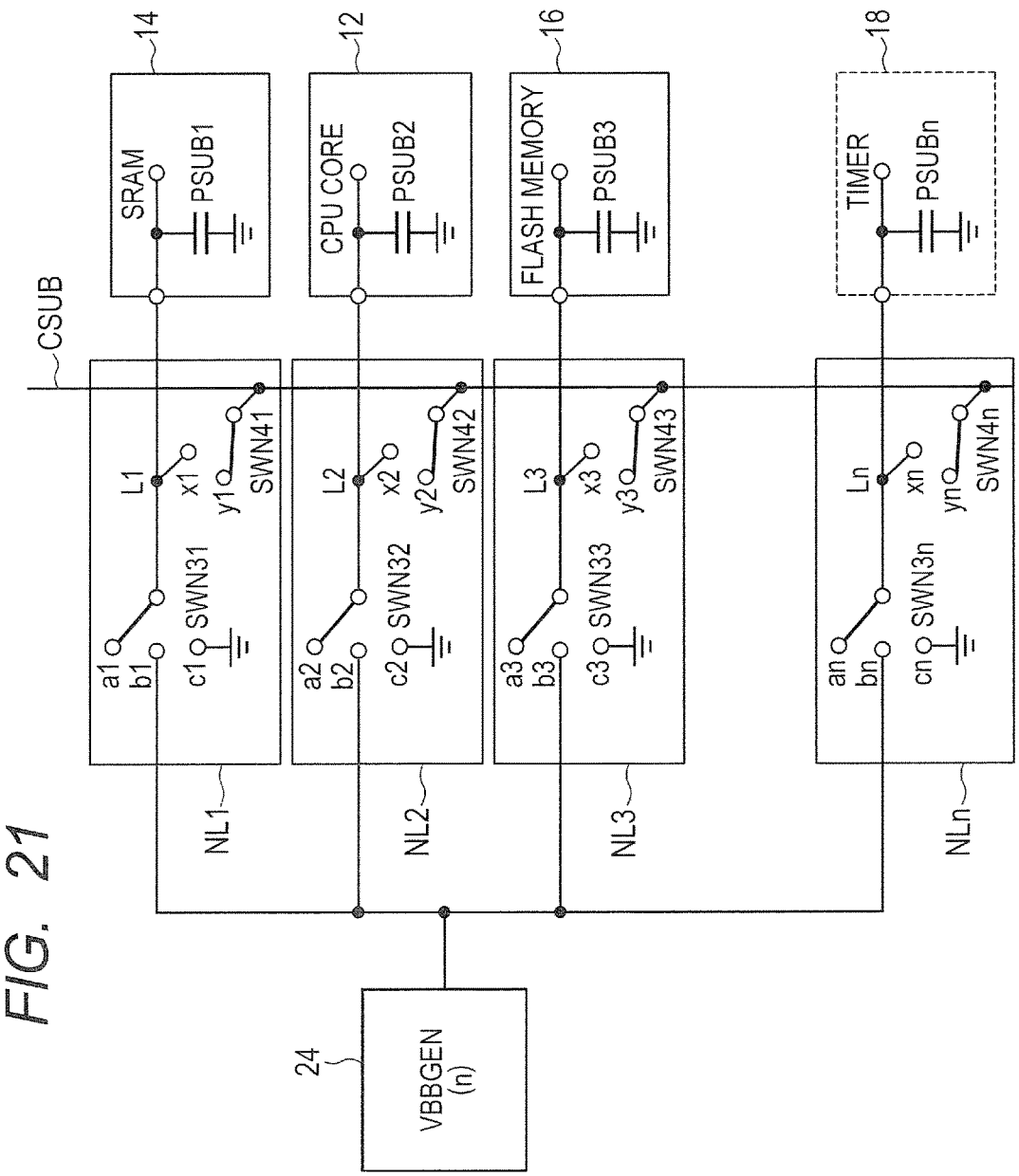
FIG. 21 is a diagram illustrating the bias control circuit according to a sixth embodiment of the present invention.

FIG. 21 is a diagram illustrating the bias control circuit according to a sixth embodiment of the present invention.

The sixth embodiment provides a unique capacitor CAP for each functional block in the chip, and includes a common substrate wiring CSUB and switches SWN4i (i=1 to n). The common substrate wiring CSUB short-circuits substrates in the individual blocks. The switches SWN4i are disposed between the substrates PSUBi and the common substrate wiring CSUB. Although the chip includes various functional blocks, a certain functional block may not be used at all. In such an instance, an unused functional block is shutoff from power, but the capacitance of the substrate remains. Therefore, the substrate capacitance of an unused functional block is used as a capacitor CAP.

As shown in FIG. 21, a switch SWN4i couples a substrate PSUBi in an unused functional block to the common substrate wiring CSUB. The unused functional block is then used as a capacitor for a functional block having high priority for back bias voltage control.

As described above, when the substrate capacitance of an unused functional block is used as a capacitor, the back bias voltage can be controlled at high speed by using the capacitor even if no dedicated capacitor for back bias voltage is available. This also saves the chip area for a dedicated capacitor for back bias voltage.

The bias control circuits NLk are capable of selectively coupling the substrate of the MOSFET included in the associated circuit block to the VBBGEN(n) 24 or to the ground GND or placing the substrate in an open-circuit state.

The switches SWN4i are capable of selectively coupling or uncoupling a node Lk in the path to the substrate of the MOSFET included in the associated circuit block to or from the common substrate wiring CSUB.

In the operating mode of a used circuit block, the bias control circuit (designated as NXi) of an unused circuit block uses a switch SWN3i to supply the output of the VBBGEN(n) to the PSUBi, which is the substrate of the MOSFET in the unused circuit block.

When a used circuit block transitions from the operating mode to the standby mode, the bias control circuit (designated as NXj) of the used circuit block uses the switches SWN4i, SWN4j and the common substrate wiring CSUB to supply the electrical charge stored in the PSUBi to a second substrate that is the substrate of the MOSFET included in the used circuit block.

FIG. 22 is a timing diagram illustrating an operation of the circuit shown in FIG. 21. It is assumed that the output voltage of the VBBGEN(n) 26 is always (−VBB), and that a substrate PSUB1 is equal in capacitance to a substrate PSUBn. It is also assumed that the SRAM 14 is a used circuit block, and that the timer 18 is an unused circuit block. That is to say, i=1 and j=n.

It is assumed that, in an initial state at time t0, the voltage vpsub1 of the substrate PSUB1 and the voltage vpsubn of the substrate PSUBn are both equal to a ground voltage of 0 V.

When the CPU core 12 sets the switch SWN31 to c1, the switch SWN41 to y1, the switch SWN3n to bn, and the switch SWN4n to yn, the VBBGEN(n) 24 is coupled to the substrate PSUBn, and the substrate PSUB1 is coupled to the ground GND. During this period, the SRAM 14 is in the operating state, and the voltage of the substrate PSUB1 remains at 0 V. The timer 18 is in a charging state so that the substrate PSUBn is gradually charged to (−VBB). The time required for such charging is governed by the maximum output current of the VBBGEN(n) 24.

When, at time t1, the voltage of the substrate PSUBn is (−VBB), the VBBGEN(n) 24 automatically stops to terminate charging.

At time t2, the semiconductor device receives an instruction for causing the SRAM 14 to transition from the operating state to the standby state. In this instance, the CPU core 12 sets the switch SWN31 to a1, the switch SWN41 to x1, the switch SWN3n to an, and the switch SWN4n to xn. This uncouples the VBBGEN (n) 24 from the substrate PSUBn, and couples the substrate PSUB1 to the substrate PSUBn through the common substrate wiring CSUB. The substrate PSUB1 is then rapidly charged by a negative electrical charge stored in the substrate PSUBn so that the voltage vpsub1 of the substrate PSUB1 and the voltage vpsubn of the substrate PSUBn are both equal to (−½)*VBB. The time required for such an operation is determined by the on-resistance of the switch SWN41 and switch SWN4n and the capacitance of the substrate PSUB1 and substrate PSUBn. However, the substrate PSUB1 can be charged more rapidly by sufficiently decreasing the on-resistance than when the substrate PSUB1 is charged by the VBBGEN(n) 24.

At time t3, the CPU core 12 further sets the switch SWN31 to b, the switch SWN41 to y1, the switch SWN3n to an, and the switch SWN4n to yn. This couples the VBBGEN(n) 24 to the substrate PSUB1 and gradually charges the substrate PSUB1 to (−VBB).

When, at time t4, the voltage of the substrate PSUB1 is (−VBB), the VBBGEN(n) 24 automatically stops to terminate charging.

At time t5, the semiconductor device receives an instruction for causing the SRAM 14 to transition from the standby state to the operating state. The CPU core 12 sets the switch SWN31 to a1, the switch SWN41 to x1, the switch SWN3n to an, and the switch SWN4n to xn. This recouples the substrate PSUB1 to the substrate PSUBn. The negative electrical charge of the substrate PSUB1 is then rapidly regenerated to the substrate PSUBn so that the voltage vpsub1 of the substrate PSUB1 and the voltage vpsubn of the substrate PSUBn are both equal to (−¾)*VBB. The time required for such a regeneration operation is determined by the on-resistance of the switch SWN41 and switch SWN4n and the capacitance of the substrate PSUB1 and substrate PSUBn. Therefore, the regeneration operation is performed at the same high speed as the operation performed at time t2.

At time t6, the CPU core 12 sets the switch SWN31 to c1, the switch SWN41 to y1, the switch SWN3n to bn, and the switch SWN4n to yn. This rapidly discharges the substrate PSUB1 to 0 V. The time required for such a discharge operation is determined by the on-resistance of the switch SWN41 and switch SWN4n and the capacitance of the substrate PSUB1. Therefore, the discharge operation is also performed at high speed. The substrate PSUBn is coupled to the VBBGEN(n) 24 and gradually charged again to (−VBB).

When, at time t7, the substrate PSUB1 is discharged to 0 V, the circuit blocks are placed in the operating state.

When, at time t8, the voltage of the substrate PSUBn is (−VBB), the VBBGEN(n) 24 automatically stops to terminate charging.

The state at time t8 is the same as the state at time t1. Subsequently, a cycle formed of states at time t1 to time t8 is repeated for processing purposes.

While the present invention made by its inventors has been described in detail in terms of particular embodiments, the present invention is not limited to the foregoing embodiments. It is to be understood by those skilled in the art that various modifications can be made without departing from the spirit and scope of the present invention.

What is claimed is:

1. A semiconductor device comprising:
   a circuit block including at least a MOSFET, and having two operating modes, namely, an operating mode and a standby mode;
   a voltage generation circuit configured to generate and output a predetermined output voltage; and
   a bias control circuit coupled between the circuit block and the voltage generation circuit and configured to receive the predetermined output voltage from the voltage generation circuit, and further configured to store an electrical charge while the circuit block is in the operating mode, supply the stored electrical charge to a substrate of the MOSFET included in the circuit block when the circuit block transitions from the operating mode to the standby mode, and subsequently supply the predetermined output voltage to the substrate of the MOSFET, the bias control circuit including at least one capacitor configured to selectively couple to an output of the voltage generation circuit in the operation mode and the standby mode, wherein the predetermined output voltage is a back bias voltage of the substrate of the MOSFET in the standby mode.

2. The semiconductor device according to claim 1,
wherein the circuit block includes an n-type MOSFET and a p-type MOSFET,
wherein the voltage generation circuit includes:
   a first portion of the voltage generation circuit that outputs a first predetermined output voltage, the first predetermined output voltage being the back bias voltage of the substrate of the n-type MOSFET in the standby mode;
   a second portion of the voltage generation circuit that outputs a second predetermined output voltage, the second predetermined output voltage being the back bias voltage of the substrate of the p-type MOSFET in the standby mode,
wherein the bias control circuit includes:
   a first portion of the bias control circuit that stores an electrical charge while the circuit block is in the operating mode, supplies the stored electrical charge to the substrate of the n-type MOSFET included in the circuit block when the circuit block transitions from the operating mode to the standby mode, and subsequently supplies the first predetermined output voltage to the substrate of the n-type MOSFET; and
   a second portion of the bias control circuit that stores an electrical charge while the circuit block is in the operating mode, supplies the stored electrical charge to the substrate of the p-type MOSFET included in the circuit block when the circuit block transitions from the operating mode to the standby mode, and subsequently supplies the second predetermined output voltage to the substrate of the p-type MOSFET.

3. The semiconductor device according to claim 1,
wherein the bias control circuit supplies an electrical charge stored in the substrate of the MOSFET to the capacitor when the circuit block transitions from the standby mode to the operating mode, and subsequently couples the substrate of the MOSFET to a supply source of a second voltage, the second voltage being the back bias voltage of the substrate of the MOSFET in the operating mode.

4. The semiconductor device according to claim 3,
wherein the bias control circuit further includes a first switch and a second switch, the capacitor being disposed between a first node and the supply source of the second voltage, the first switch being configured to selectively open or close a path between the first node and the output of the voltage generation circuit, the second switch being configured to selectively couple the substrate of the MOSFET to the voltage generation circuit, to the first node, or to the supply source of the second voltage.

5. The semiconductor device according to claim 4,
wherein, in the operating mode, the first switch opens the path, and the second switch couples the substrate of the MOSFET to the supply source of the second voltage, wherein, upon receiving an instruction for transitioning from the operating mode to the standby mode, the first switch closes the path, and the second switch first couples the substrate of the MOSFET to the first node and then couples the substrate of the MOSFET to the voltage generation circuit, and wherein, upon receiving an instruction for transitioning from the standby mode to the operating mode, the first switch closes the path and the second switch couples the substrate of the MOSFET to the first node, and subsequently, the first switch opens the path and the second switch couples the substrate of the MOSFET to the supply source of the second voltage.

6. The semiconductor device according to claim 3,
wherein the bias control circuit further includes a first switch, a second switch, and a third switch, the capacitor being disposed between a first node and a second node, the first switch being configured to selectively couple the first node to the output of the voltage generation circuit or to the supply source of the second voltage or placing the first node in an open-circuit state, the second switch being configured to selectively couple the substrate of the MOSFET to the voltage generation circuit, to the first node, or to the supply source of the second voltage, the third switch being configured to selectively couple the second node to a supply source of a third voltage or to the supply source of the second voltage.

7. The semiconductor device according to claim 6,
wherein, in the operating mode, the first switch couples the first node to the supply source of the second voltage, the second switch couples the substrate of the MOSFET to the supply source of the second voltage, and the third switch couples the second node to the supply source of the third voltage, wherein, subsequently, the first switch is placed in the open-circuit state, the second switch keeps the substrate of the MOSFET coupled to the supply source of the second voltage, and the third switch couples the second node to the supply source of the second voltage, wherein, upon receiving an instruction for transitioning from the operating mode to the standby mode, the first switch remains in the open-circuit state, the second switch couples the substrate of the MOSFET to the first node, and the third switch keeps the second node coupled to the supply source of the second voltage, wherein, subsequently, the first switch remains in the open-circuit state, the second switch couples the substrate of the MOSFET to the voltage generation circuit, and the third switch keeps the second node coupled to the supply source of the second voltage, wherein, upon receiving an instruction for transitioning from the standby mode to the operating mode, the first switch remains in the open-circuit state, the second switch couples the substrate of the MOSFET to the first node, and the third switch keeps the second node coupled to the supply source of the second voltage, wherein, subsequently, the first switch couples the first node to the supply source of the second voltage, the second switch couples the substrate of the MOSFET to the supply source of the second voltage, and the third switch couples the second node to the supply source of the third voltage, and wherein, subsequently, the first switch is placed in the open-circuit state, the second switch keeps the substrate of the MOSFET coupled to the supply source of the second voltage, and the third switch couples the second node to the supply source of the second voltage.

8. The semiconductor device according to claim 6, wherein, in the operating mode, the first switch couples the first node to the supply source of the second voltage, the second switch couples the substrate of the MOSFET to the supply source of the second voltage, and the third switch couples the second node to the supply source of the third voltage, wherein, subsequently, the first switch couples the first node to the output of the voltage generation circuit, the second switch keeps the substrate of the MOSFET coupled to the supply source of the second voltage, and the third switch keeps the second node coupled to the supply source of the third voltage, wherein, subsequently, the first switch is placed in the open-circuit state, the second switch keeps the substrate of the MOSFET coupled to the supply source of the second voltage, and the third switch couples the second node to the supply source of the second voltage, wherein, upon receiving an instruction for transitioning from the operating mode to the standby mode, the first switch remains in the open-circuit state, the second switch couples the substrate of the MOSFET to the first node, and the third switch keeps the second node coupled to the supply source of the second voltage, wherein, subsequently, the first switch remains in the open-circuit state, the second switch couples the substrate of the MOSFET to the voltage generation circuit, and the third switch keeps the second node coupled to the supply source of the second voltage, wherein, upon receiving an instruction for transitioning from the standby mode to the operating mode, the first switch couples the first node to the output of the voltage generation circuit, the second switch couples the substrate of the MOSFET to the supply source of the second voltage, and the third switch couples the second node to the supply source of the third voltage, and wherein, subsequently, the first switch is placed in the open-circuit state, the second switch keeps the substrate of the MOSFET coupled to the supply source of the second voltage, and the third switch couples the second node to the supply source of the second voltage.

9. The semiconductor device according to claim 2, wherein the first portion of the bias control circuit includes a first capacitor configured to selectively couple to an output of the first portion of the voltage generation circuit, and wherein the second portion of the bias control circuit includes a second capacitor configured to selectively couple to an output of the second portion of the voltage generation circuit.

10. A semiconductor device comprising:
a plurality of circuit blocks having two operating modes, namely, an operating mode and a standby mode;
a voltage generation circuit that is commonly provided for the circuit blocks and which is configured to generate and output a predetermined output voltage; and
a plurality of bias control circuits that are provided respectively for the circuit blocks, and configured to receive the predetermined output voltage from the voltage generation circuit,
wherein the bias control circuits each store an electrical charge supplied from the voltage generation circuit when the associated circuit block in the operating mode is selected, supplies the stored electrical charge to a substrate of a MOSFET included in the associated circuit block when the associated circuit block transitions from the operating mode to the standby mode, and subsequently supplies the predetermined output voltage to the substrate of the MOSFET,
wherein the circuit blocks are each assigned different priorities and selected according to the assigned priorities, and
wherein the predetermined output voltage is a back bias voltage of the substrate of the MOSFET in the standby mode.

11. A semiconductor device comprising:
a plurality of circuit blocks having two operating modes, namely, an operating mode and a standby mode;
a voltage generation circuit that is commonly provided for the circuit blocks and which is configured to generate and output a predetermined output voltage; and
a plurality of bias control circuits that are provided respectively for the circuit blocks, and configured to receive the predetermined output voltage from the voltage generation circuit,
wherein a bias control circuit for an unused circuit block supplies the predetermined output voltage of the voltage generation circuit to a first substrate in the operating mode of a used circuit block, the first substrate being a substrate of a MOSFET in the unused circuit block, and
wherein a bias control circuit for a used circuit block supplies an electrical charge stored in the first substrate to a second substrate when the used circuit block transitions from the operating mode to the standby mode, and subsequently supplies the predetermined output voltage of the voltage generation circuit to the second substrate, the second substrate being a substrate of a MOSFET in the used circuit block.

12. The semiconductor device according to claim 11, further comprising:
a common wiring that is commonly provided for the circuit blocks,
wherein the bias control circuits each include a first switch and a second switch, the first switch being configured to selectively couple a substrate of a MOSFET included in the associated circuit block to the voltage generation circuit or to a supply source of a second voltage or placing the substrate of the MOSFET in an open-circuit state, the second switch being configured to selectively couple or uncouple the common wiring to or from a node in a path between the first switch and the substrate of the MOSFET, and
wherein the second voltage is a back bias voltage of the substrate of the MOSFET in the operating mode.

13. The semiconductor device according to claim 12, wherein, when the used circuit block is in the operating mode, in the bias control circuit for the unused circuit block, the first switch couples the substrate of the MOSFET to the voltage generation circuit whereas the second switch refrains from coupling the node to the common wiring, or in the bias control circuit for the used circuit block, the first switch couples the substrate of the MOSFET to the supply source of the second voltage whereas the second switch refrains from coupling the node to the common wiring, and wherein, when the used circuit block receives an instruction for transitioning from the operating mode to the standby mode, in the bias control circuit for the unused circuit block, the first switch is placed in an open-circuit state and the second switch couples the node to the common wiring, or in the bias control circuit for the used circuit block, the first switch is placed in the open-circuit state whereas the second switch couples the node to the common wiring and subsequently the first switch couples the substrate of the MOSFET to the voltage generation circuit whereas the second switch refrains from coupling the node to the common wiring.

* * * * *